(12) United States Patent
Nakamura et al.

(10) Patent No.: US 8,294,166 B2
(45) Date of Patent: *Oct. 23, 2012

(54) TRANSPARENT LIGHT EMITTING DIODES

(75) Inventors: Shuji Nakamura, Santa Barbara, CA (US); Steven P. DenBaars, Goleta, CA (US); Hirokuni Asamizu, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 158 days.

This patent is subject to a terminal disclaimer.

(21) Appl. No.: 11/954,154

(22) Filed: Dec. 11, 2007

(65) Prior Publication Data

US 2008/0149959 A1   Jun. 26, 2008

Related U.S. Application Data

(60) Provisional application No. 60/869,447, filed on Dec. 11, 2006.

(51) Int. Cl.
    *H01L 33/00*    (2010.01)
(52) U.S. Cl. .............. 257/98; 257/95; 257/99; 257/103; 257/E33.064; 257/E33.074
(58) Field of Classification Search .............. 257/9, 99, 257/100, 14, 95, 98, E29.072, E29.076, E33.008, 257/E31.033, 103, E33.067, E33.07, E33.074
See application file for complete search history.

(56) References Cited

U.S. PATENT DOCUMENTS

| | | | | |
|---|---|---|---|---|
| 5,708,280 A | * | 1/1998 | Lebby et al. | 257/88 |
| 5,905,275 A | * | 5/1999 | Nunoue et al. | 257/95 |
| 5,952,681 A | * | 9/1999 | Chen | 257/89 |
| 6,515,308 B1 | * | 2/2003 | Kneissl et al. | 257/86 |
| 6,607,286 B2 | | 8/2003 | West et al. | |
| 6,674,096 B2 | | 1/2004 | Sommers | |
| 6,730,939 B2 | * | 5/2004 | Eisert et al. | 257/98 |
| 6,791,119 B2 | | 9/2004 | Slater, Jr. et al. | |
| 6,844,572 B2 | * | 1/2005 | Sawaki et al. | 257/94 |
| 6,917,057 B2 | | 7/2005 | Stokes et al. | |
| 6,936,761 B2 | * | 8/2005 | Pichler | 136/256 |
| 6,961,190 B1 | | 11/2005 | Tamaoki et al. | |
| 6,997,580 B2 | | 2/2006 | Wong | |
| 7,053,419 B1 | | 5/2006 | Camras et al. | |
| 7,268,371 B2 | | 9/2007 | Krames et al. | |
| 7,390,117 B2 | | 6/2008 | Leatherdale et al. | |
| 2002/0141006 A1 | * | 10/2002 | Pocius et al. | 359/15 |
| 2002/0171087 A1 | | 11/2002 | Krames et al. | |
| 2003/0015959 A1 | * | 1/2003 | Tomoda et al. | 313/498 |
| 2003/0039119 A1 | * | 2/2003 | Cao | 362/227 |

(Continued)

OTHER PUBLICATIONS

Fujii, T. et al., "Increase in the extraction efficiency of GaN-based light-emitting diodes via surface roughening," Appl. Phys. Lett., Feb. 9, 2004, pp. 855-857, vol. 84, No. 6.

Jasinski, J. et al., "Microstructure of GaAs/GaN interfaces produced by direct wafer fusion," Appl. Phys. Lett., Oct. 21, 2002, pp. 3152-3154, vol. 81, No. 17.

Kish, F.A. et al., "Very high-efficiency semiconductor wafer-bonded transparent-substrate (AlxGz1-x)0.5ln0.5P/GaP light-emitting diodes," Appl. Phys. Lett., May 23, 1994, pp. 2839-2841, vol. 64, No. 21.

(Continued)

*Primary Examiner* — Teresa M Arroyo
(74) *Attorney, Agent, or Firm* — Gates & Cooper LLP

(57) ABSTRACT

A transparent light emitting diode (LED) includes a plurality of III-nitride layers, including an active region that emits light, wherein all of the layers except for the active region are transparent for an emission wavelength of the light, such that the light is extracted effectively through all of the layers and in multiple directions through the layers. Moreover, the surface of one or more of the III-nitride layers may be roughened, textured, patterned or shaped to enhance light extraction.

42 Claims, 14 Drawing Sheets

CONVENTIONAL LED

U.S. PATENT DOCUMENTS

| | | | |
|---|---|---|---|
| 2003/0124754 A1* | 7/2003 | Farahi et al. | 438/29 |
| 2003/0213969 A1* | 11/2003 | Wang et al. | 257/98 |
| 2004/0188700 A1* | 9/2004 | Fukasawa et al. | 257/100 |
| 2005/0035354 A1* | 2/2005 | Lin et al. | 257/79 |
| 2005/0093008 A1* | 5/2005 | Suehiro et al. | 257/98 |
| 2005/0121688 A1* | 6/2005 | Nagai et al. | 257/99 |
| 2005/0145865 A1* | 7/2005 | Okuyama et al. | 257/98 |
| 2005/0196887 A1 | 9/2005 | Liu | |
| 2006/0000964 A1* | 1/2006 | Ye et al. | 250/208.1 |
| 2006/0038187 A1* | 2/2006 | Ueno | 257/81 |
| 2006/0043399 A1* | 3/2006 | Miyagaki et al. | 257/98 |
| 2006/0125385 A1* | 6/2006 | Lu et al. | 313/506 |
| 2006/0154392 A1 | 7/2006 | Tran et al. | |
| 2006/0194363 A1* | 8/2006 | Giesberg et al. | 438/99 |
| 2006/0202219 A1* | 9/2006 | Ohashi et al. | 257/98 |
| 2006/0237732 A1* | 10/2006 | Nagai et al. | 257/91 |
| 2006/0239006 A1* | 10/2006 | Chaves et al. | 362/294 |
| 2006/0273336 A1* | 12/2006 | Fujikura et al. | 257/98 |
| 2007/0019409 A1* | 1/2007 | Nawashiro et al. | 362/231 |
| 2007/0120135 A1* | 5/2007 | Soules et al. | 257/98 |
| 2008/0169752 A1* | 7/2008 | Hattori et al. | 313/503 |
| 2009/0078951 A1* | 3/2009 | Miki et al. | 257/98 |
| 2009/0140630 A1* | 6/2009 | Kijima et al. | 313/498 |
| 2010/0059787 A1* | 3/2010 | Hoshina | 257/100 |

OTHER PUBLICATIONS

Liau, Z.L. et al., "Wafer fusion: A novel technique for optoelectronic device fabrication and monolithic integration," Appl. Phys. Lett., Feb. 19, 1990, pp. 737-739, vol. 56, No. 8.

Murai, A. et al., "Wafer Bonding of GaN and ZnSSe for Optoelectronic Applications," Jpn. J. Appl. Phys., 2004, pp. L1275-L1277, vol. 43, No. 10A.

Nakahara, K. et al., "Improved External Efficiency InGaN-Based Light-Emitting Diodes with Transparent Conductive Ga-Doped ZnO as p-Electrodes," Jpn. J. Appl. Phys., 2004, pp. L180-L182, vol. 43, No. 2A.

Nakamura, S. et al., "High-Brightness InGaN Blue, Green and Yellow Light-Emitting Diodes with Quantum Well Structures," Jpn. J. Appl. Phys., Jul. 1, 1995, pp. L797-L799, vol. 34, Part 2, No. 7A.

Narukawa, Y. et al., "Ultra-High Efficiency White Light Emitting Diodes," Jpn. J. Appl. Phys., 2006, pp. L1084-L1086, vol. 45, No. 41.

International Search Report mailed Mar. 10, 2008, International application No. PCT/US07/25343, International filing date Dec. 11, 2007.

\* cited by examiner

CONVENTIONAL LED

CONVENTIONAL LED

CONVENTIONAL LED

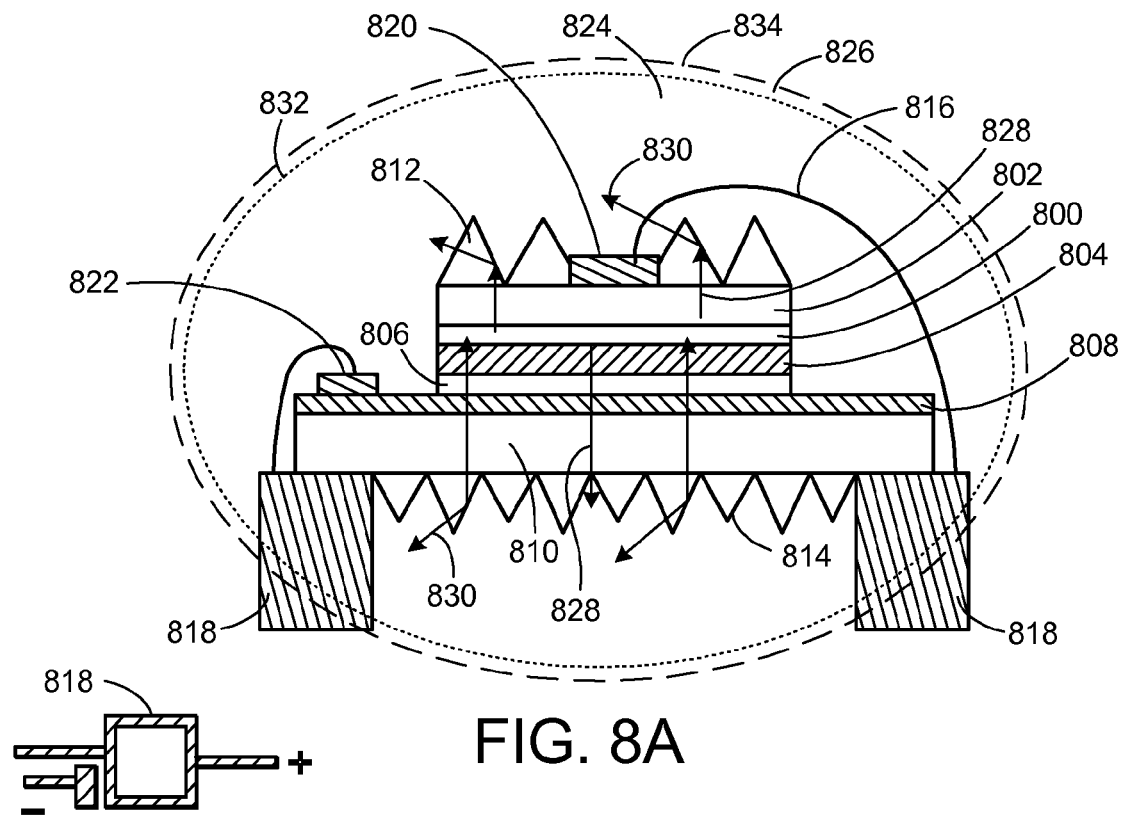
FIG. 8A
FIG. 8B
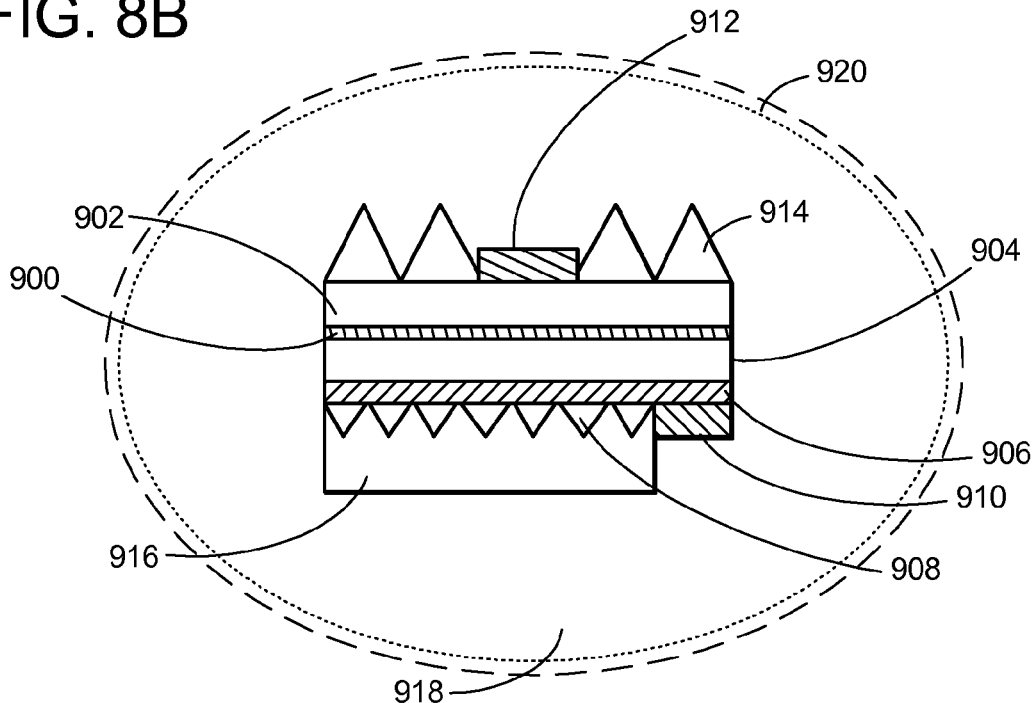
FIG. 9

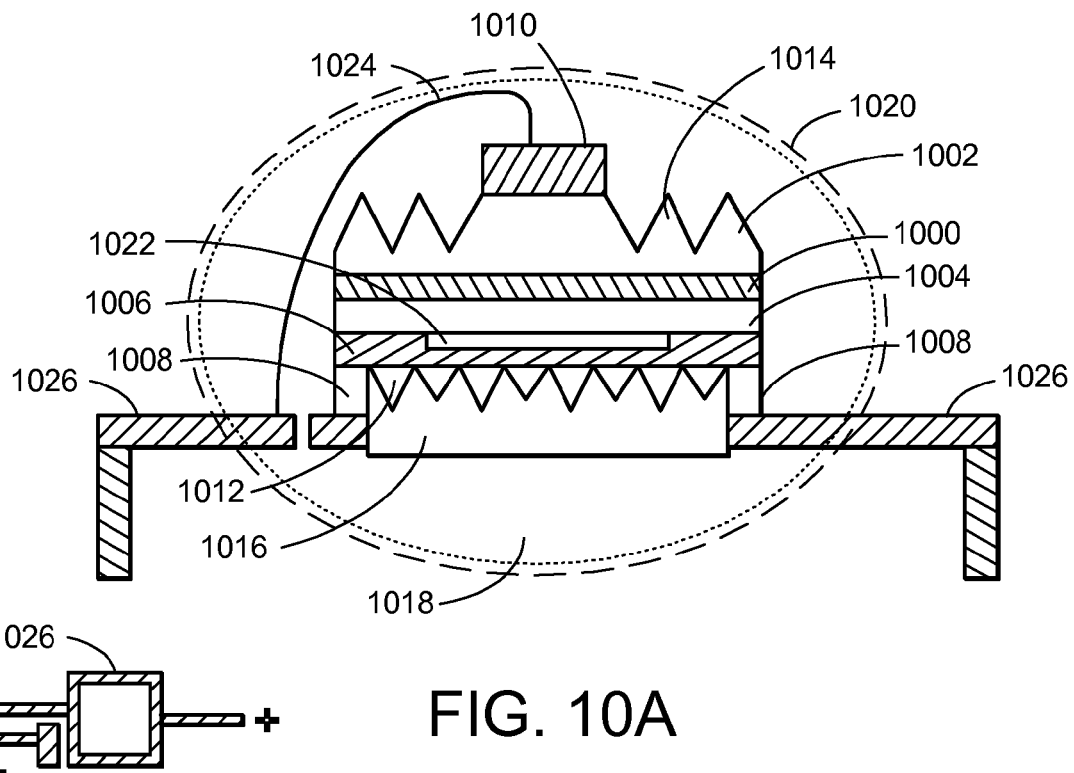
FIG. 10A
FIG. 10B
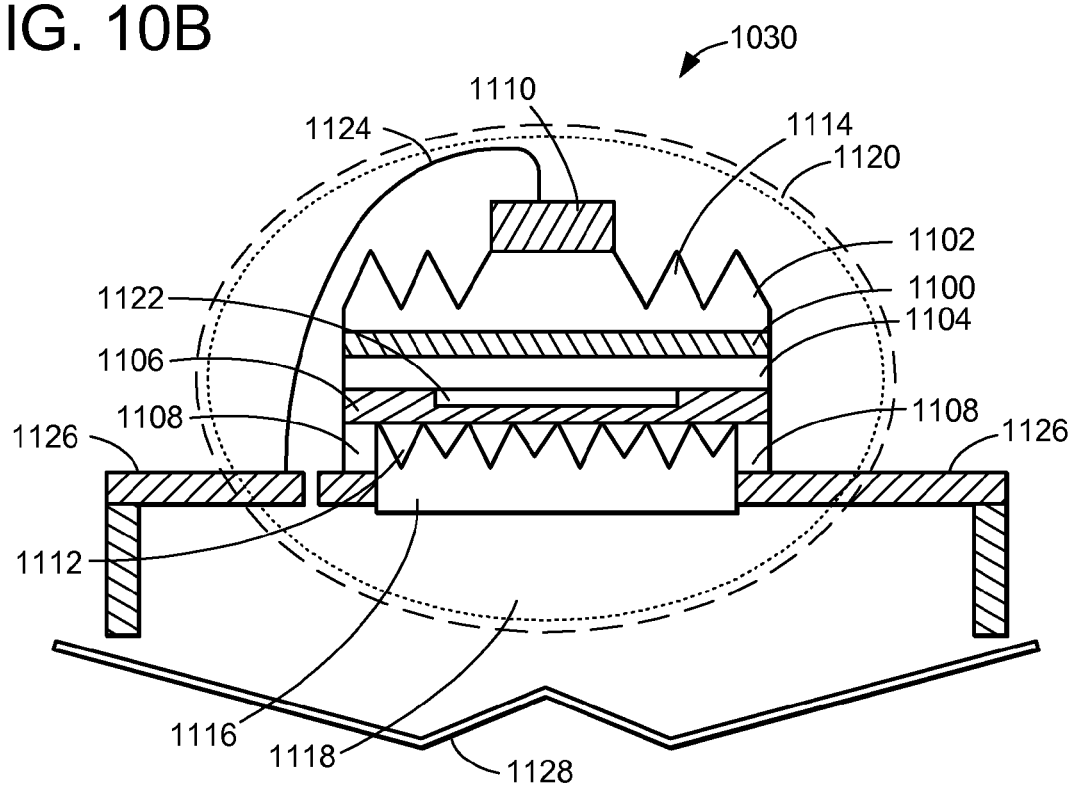
FIG. 11

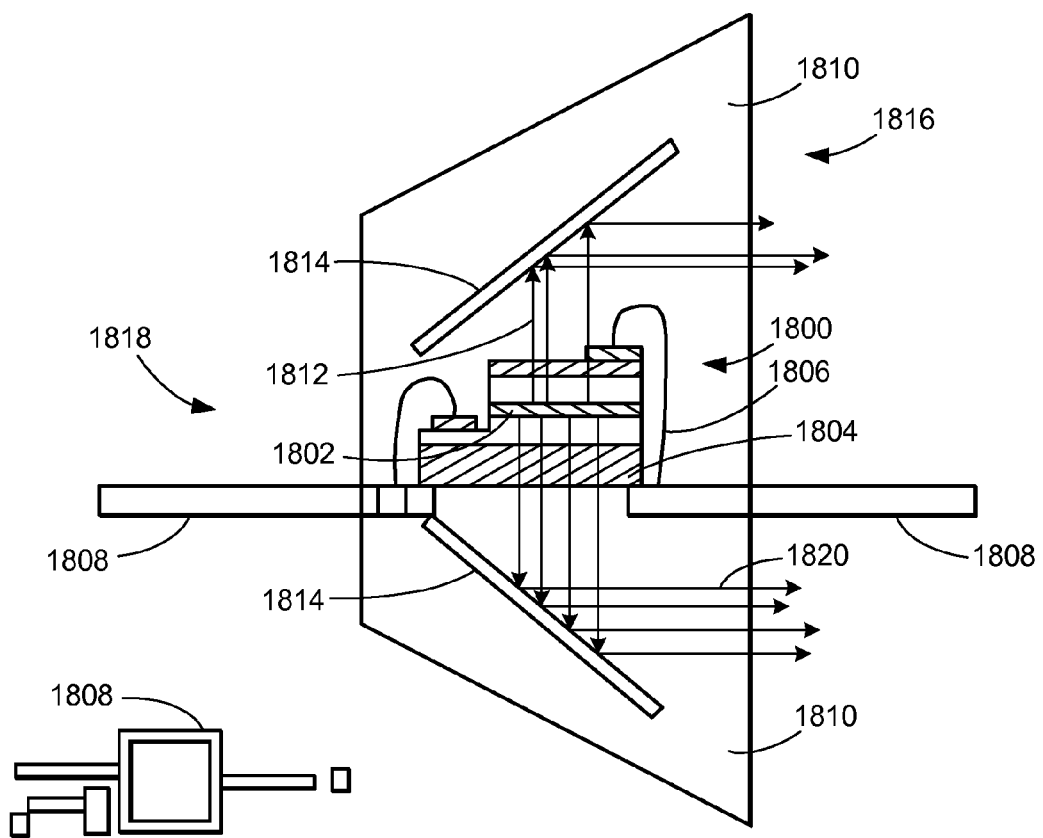
FIG. 18A
FIG. 18B
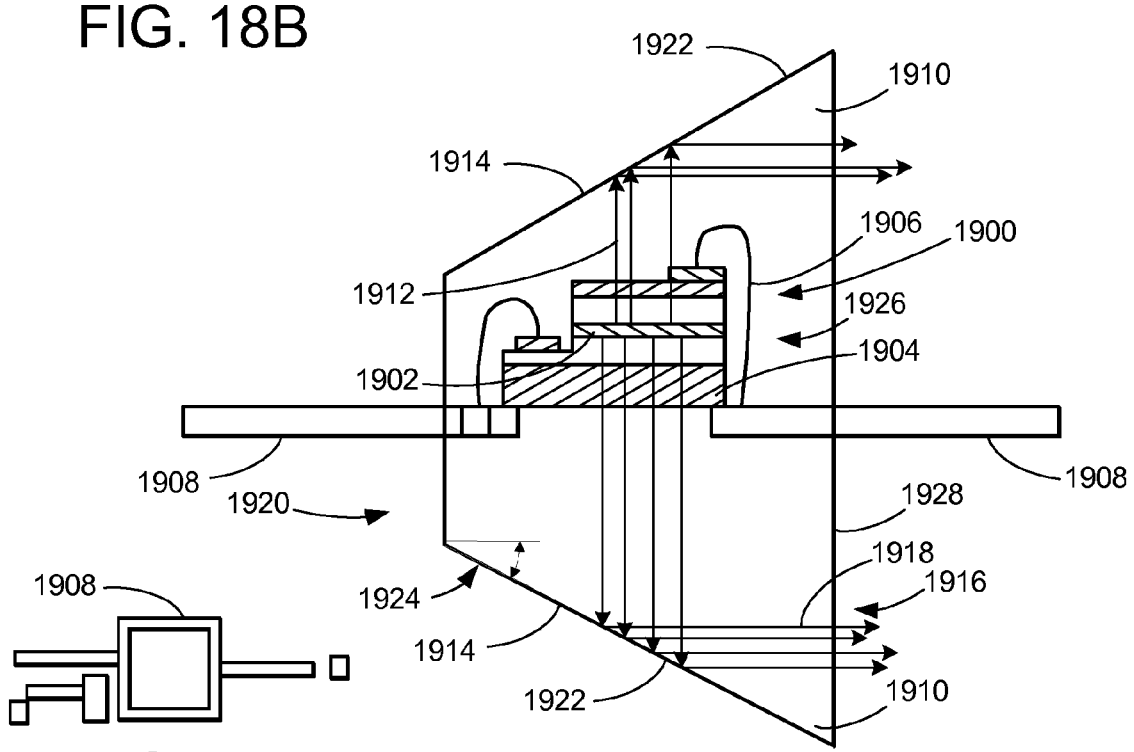
FIG. 19B    FIG. 19A

TRANSPARENT LIGHT EMITTING DIODES

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/869,447, filed on Dec. 11, 2006, by Shuji Nakamura, Steven P. DenBaars, and Hirokuni Asamizu, entitled, "TRANSPARENT LEDS,");

which application is incorporated by reference herein.

This application is related to the following co-pending and commonly-assigned applications:

U.S. Utility application Ser. No. 10/581,940, tiled on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," now U.S. Pat. No. 7,704,763, issued Apr. 27, 2010, which application claims the benefit under 35 U.S.C Section 365(c) of PCT Application Ser. No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE,";

U.S. Utility application Ser. No. 11/175,761, filed on Jul. 6, 2005, now U.S. Pat. No. 7,344,958, issued Mar. 18, 2005. by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,", which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,";

U.S. Utility application Ser. No. 11/697,457, filed Apr. 6, 2007, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,", now U.S. Pat. No. 7,956,360, issued Jun. 7, 2011, which application is a continuation of U.S. Utility application Ser. No. 11/140,893, filed May 31, 2005, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,", now U.S. Pat. No. 7,208,393, issued Apr. 24, 2007, which application claims the benefit under 35 U.S.C. Section 119(e) of U.S. Provisional Application Ser. No. 60/576,685, filed Jun. 3, 2004, by Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,";

U.S. Utility application Ser. No. 11/067,957, filed Feb. 28, 2005, now U.S. Pat. No. 7,345,298, issued Mar. 18, 2008. by Claude C. A. Weisbuch, Aurelien J. F. David, James S. Speck and Steven P. DenBaars, entitled "HORIZONTAL EMITTING, VERITCAL EMITTING, BEAM SHAPED, DISTRIBUTED FEEDBACK (DFB) LASERS BY GROWTH OVER A PATTERNED SUBSTRATE,";

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," now U.S. Pat. No. 7,755 096, issued Jul. 13, 2010, which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,";

U.S. Utility application Ser. No. 11/067,956, filed Feb. 28, 2005, now U.S. Pat. No. 7,582,910, issued Sep. 1, 2009, by Aurelien J.F. David, Claude C.A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/621,482, filed Jan. 9, 2007, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE, " now U.S. Pat. No. 7,704,331, issued Apr. 27, 2010, which application is a continuation of U.S. Utility application Ser. No. 11/372,914, filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,", now U.S. Pat. No. 7,220,324, issued May 22, 2007, which application claims the benefit under 35 U.S.C. Section 119(e) of U.S. Provisional Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,", which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,";

U.S. Utility application Ser. No. 11/403,288, filed Apr. 13, 2006, by James S. Speck, Benjamin A. Haskell, P. Morgan Pattison and Troy '. Baker, entitled "ETCHING TECHNIQUE FOR THE FABRICATION OF THIN (AL, IN, GA)N LAYERS," now U.S. Pat. No. 7,795,146, issued Sep. 14, 2010, which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," now U.S. Pat. No. 7,719,020, issued May 18, 2010, which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD,", U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,", and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(A1,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/444,084, filed May 31, 2006, now U.S. Pat. No. 7,361,576, issued Apr. 22, 2008, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH, ", which claims the benefit under 35 U.S.C. 119(e) of U.S. Provisional Application Ser. No. 60/685,952, filed on May 31, 2005, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH,";

U.S. Utility application Ser. No. 11/870,115, filed Oct. 10, 2007, by Bilge M, Imer, James S. Speck, Steven P. DenBaars and Shuji Nakamura, entitled "GROWTH OF PLANAR NON-POLAR M-PLANE III-NITRIDE USING METALORGANIC CHEMICAL VAPOR DEPOSITION (MOCVD), " now U.S. Pat. No. 8,097,481, issued Jan. 17, 2012, which application is a continuation of U.S. Utility application Ser. No. 11/444,946, filed May 31, 2006, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD), " now U.S. Pat. No. 7,846,757, issued Dec. 7, 2010, which claims the benefit under 35 U.S.C. 119(e) of U.S. Provisional Application Ser. No. 60/685,908, filed on May 31, 2005, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD),";

U.S. Utility application Ser. No. 11/444,946, filed Jun. 1, 2006, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETEROSTRUCTURES, AND DEVICES, " now U.S. Pat. No. 7,846,757, issued Dec. 7, 2010, which claims the benefit under 35 U.S.C. 119(e) of U.S. Provisional Application Ser. No. 60/686,244, filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETEROSTRUCTURES, AND DEVICES,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES," now U.S. Pat. No. 7,768,023, issued Aug. 3, 2010;

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," now U.S. Pat. No. 7,768,024, issued Aug. 3, 2010, which application claims the benefit under 35 U.S.C Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Utility Application Ser. No. 11/517,797, filed Sep. 8, 2006, now U.S. Pat. No. 7,575,947, issued Aug. 18, 2009, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION, ", which claims the benefit under 35 U.S.C. 119(e) of U.S. Provisional Application Ser. No. 60/715,491, filed on Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION, ";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," now U.S. Pat. No. 7,994,527, issued Aug. 9, 2011, which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED)," now U.S. Pat. No. 7,956 371, issued Jun. 7, 2011, which application claims the benefit under 35 U.S.C Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),", and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMIPOLAR (Al, In,Ga,B)N OPTOELECTRONIC DEVICES," now U.S. Pat.

No. 7,858,996, issued Dec. 28, 2010, which application claims the benefit under 35 U.S.C Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (A1,In,Ga,B)N OPTOELECTRONIC DEVICES,";

U.S. Utility patent application Ser. No. 11/840,057, filed on Aug. 16, 2007, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS," now U.S. Pat. No. 7,709,284, issued May 4, 2010, which claims the benefit under 35 U.S.C. 119(e) of U.S. Provisional Patent Application Ser. No. 60/822,600, filed on Aug. 16, 2006, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS,";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,", which application claims the benefit under 35 U.S.C Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,", and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,";

U.S. Utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LIGHT EMITTING DIODES (LEDS) BY INDEX MATCHING STRUCTURES," now abandoned, which application claims the benefit under 35 U.S.C Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,";

U.S. Utility patent application Ser. No. 11/940,866, filed on Nov. 15, 2007, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS," now U.S. Pat. No. 7,977,694, issued Jul. 12, 2011, which application claims the benefit under 35 U.S.C Section 119(e) of U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS,";

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,", which application claims the benefit under 35 U.S.C Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE,", which application claims the benefit under 35 U.S.C Section 119(e) of U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED,", which application claims the benefit under 35 U.S.C Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,";

U.S. Utility patent application Ser. No. 11/940,883, filed on Nov. 15, 2007, by Shuji Nakamura and Steven P. DenBaars, entitled "STANDING TRANSPARENT MIRROR-LESS LIGHT EMITTING DIODE," now U.S. Pat. No. 7,687,813, issued Mar. 30, 2010, which application claims the benefit under 35 U.S.C Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE,";

U.S. Utility patent application Ser. No. 11/940,898, filed on Nov. 15, 2007, by Steven P. DenBaars, Shuji Nakamura and James S. Speck, entitled "TRANSPARENT MIRROR-LESS LIGHT EMITTING DIODE," now U.S. Pat. No. 7,781,789, issued Aug. 24, 2010, which application claims the benefit under 35 U.S.C Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

U.S. Utility patent application Ser. No. 11/954,163, filed on Dec. 11, 2007, by Steven P. DenBaars and Shuji Nakamura, entitled "LEAD FRAME FOR TRANSPARENT MIRRORLESS LIGHT EMITTING DIODE,", which claims the benefit under 35 U.S.C. 119(e) of U.S. Provisional Patent Application Ser. No. 60/869,454, filed on Dec. 11, 2006, by Steven P. DenBaars and Shuji Nakamura, entitled "LEAD FRAME FOR TM-LED,";

U.S. Utility patent application Ser. No. 12/001,286, filed on Dec. 11, 2007, by Mathew C. Schmidt, Kwang Choong Kim, Hitoshi Sato, Steven P. DenBaars, James S. Speck, and Shuji Nakamura, entitled "METALORGANIC CHEMICAL VAPOR DEPOSITION (MOCVD) GROWTH OF HIGH PERFORMANCE NON-POLAR III-NITRIDE OPTICAL DEVICES,", now U.S. Pat. No. 7,842,527 issued on Nov. 30, 2010, which claims the benefit under 35 U.S.C. 119(e) of U.S. Provisional Patent Application Ser. No. 60/869,535, filed on Dec. 11, 2006, by Mathew C. Schmidt, Kwang Choong Kim, Hitoshi Sato, Steven P. DenBaars, James S. Speck, and Shuji Nakamura, entitled "MOCVD GROWTH OF HIGH PERFORMANCE M-PLANE GAN OPTICAL DEVICES,";

U.S. Utility patent application Ser. No. 12/001,227, filed on Dec. 11, 2007, by Steven P. DenBaars, Mathew C. Schmidt, Kwang Choong Kim, James S. Speck, and Shuji Nakamura, entitled, "NON-POLAR AND SEMI-POLAR EMITTING DEVICES,", which claims the benefit under 35 U.S.C. 119(e) of U.S. Provisional Patent Application Ser. No. 60/869,540, filed on Dec. 11, 2006, by Steven P. DenBaars, Mathew C. Schmidt, Kwang Choong Kim, James S. Speck, and Shuji Nakamura, entitled, "NON-POLAR (M-PLANE) AND SEMI-POLAR EMITTING DEVICES,"; and U.S. Utility patent application Ser. No. 11/954,172, filed on Dec. 11, 2007, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMIPOLAR PLANES OF (AL, IN, GA, B)N ON VARIOUS SUBSTRATES,", which claims the benefit under 35 U.S.C. 119(e) of U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMIPOLAR PLANES OF (Alabama, Indiana, Georgia, B)N ON VARIOUS SUBSTRATES,";

all of which applications are incorporated by reference herein.

The Names of The Parties to A Joint Research Agreement

The presently claimed invention was made by or on behalf of a party, The Regents of the University of California, to a Joint Research Agreement. The Joint Research Agreement was in effect on or before the date the claimed invention was made, and the claimed invention was made as a result of activities undertaken within the scope of the Joint Research Agreement. The parties to the Joint Research Agreement are The Regents of the University of California and Japan Science and Technology Agency.

BACKGROUND OF THE INVENTION

1. Field of the Invention

The present invention is related to light extraction from light emitting diodes (LEDs).

2. Description of the Related Art (Note: This application references a number of different publications as indicated throughout the specification. In addition, a list of a number of different publications can be found below in the section entitled "References." Each of these publications is incorporated by reference herein.)

In order to increase the light output power from the front side of a light emitting diode (LED), the emitted light is reflected by a mirror placed on the backside of the substrate or is reflected by a mirror coating on the lead frame, even if there are no mirrors on the backside of the substrate, if the bonding material is transparent on the emission wavelength. However, this reflected light is re-absorbed by the emitting layer (active layer), because the photon energy is almost same as the bandgap energy of the light emitting species, such as AlInGaN multiple quantum wells (MQWs). The efficiency or output power of the LEDs is decreased due to this re-absorption of the light by the emitting layer. See, for example, FIGS. 1, 2 and 3, which are described in more detail below. See also Jpn. J. Appl. Phys., 34, L797-99 (1995) and Jpn. J. Appl. Phys., 43, L180-82 (2004).

What is needed in the art are LED structures that more effectively extract light. The present invention satisfies that need.

SUMMARY OF THE INVENTION

The present invention describes a transparent light emitting diode. Generally, the present invention describes a light emitting device comprised of a plurality of III-nitride layers, including an active region that emits light, wherein all of the layers except for the active region are transparent for an emission wavelength of the light, such that the light is extracted effectively through all of the layers and in multiple directions through the layers. Moreover, the surface of one or more of the III-nitride layers may be roughened, textured, patterned or shaped to enhance light extraction.

In one embodiment, the III-nitride layers reside on a transparent substrate or sub-mount, wherein the III-nitride layers are wafer bonded with the transparent substrate or sub-mount using a transparent glue, a transparent epoxy, or other transparent material, and light is extracted through the transparent substrate or sub-mount. The transparent substrate or sub-mount are electrically conductive, as is the transparent glue, transparent epoxy, or other transparent material.

A lead frame supports the III-nitride layers (as well as the transparent substrate or sub-mount), which reside on a transparent plate in the lead frame. Thus, the light emitted from the III-nitride layers is transmitted through the transparent plate in the lead frame.

Moreover, the device may include one or more transparent conducting layers that are positioned to electrically connect the III-nitride layers, and one or more current spreading layers that are deposited on the III-nitride layers, wherein the transparent conducting layers are deposited on the current spreading layers. Mirrors or mirrored surfaces are eliminated from the device to minimize internal reflections in order to minimize re-absorption of the light by the active region.

In another embodiment, the III-nitride layers are embedded in or combined with a shaped optical element, and the light is extracted from more than one surface of the III-nitride layers before entering the shaped optical element and subsequently being extracted. Specifically, at least a portion of the light entering the shaped optical element lies within a critical angle and is extracted. Moreover, one or more surfaces of the shaped optical element may be roughened, textured, patterned or shaped to enhance light extraction. Further, the shaped optical element may include a phosphor layer, which may be roughened, textured, patterned or shaped to enhance light extraction. The shaped optical element may be an inverted cone shape, wherein the III-nitride layers are positioned within the inverted cone shape such that the light is reflected by sidewalls of the inverted cone shape.

In yet another embodiment, an insulating layer covering the III-nitride layers is partially removed, and a conductive layer is deposited within a hole or depression in the surface of the insulating layer to make electrical contact with the III-nitride layers.

BRIEF DESCRIPTION OF THE DRAWINGS

Referring now to the drawings in which like reference numbers represent corresponding parts throughout:

FIGS. 8A and 8B are schematic and plan view illustrations, respectively, of an improved LED structure according to the preferred embodiment of the present invention.

FIG. 9 is a schematic illustration of an improved LED structure according to the preferred embodiment of the present invention.

FIGS. 10A and 10B are schematic and plan view illustrations, respectively, of an improved LED structure according to the preferred embodiment of the present invention.

FIG. 11 is a schematic illustration of an improved LED structure according to the preferred embodiment of the present invention.

FIGS. 18A and 18B are schematic and plan view illustrations, respectively, of an improved LED structure according to the preferred embodiment of the present invention.

FIGS. 19A and 19B are schematic and plan view illustrations, respectively, of an improved LED structure according to the preferred embodiment of the present invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

In the following description of the figures, the details of the LED structures are not shown. Only the emitting layer (usually AlInGaN MQW), p-type GaN layer, n-type GaN layer and sapphire substrate are shown. Of course, there may be other layers in the LED structure, such as a p-AlGaN electron blocking layer, InGaN/GaN super lattices and others. In this invention, the most important aspects are the surfaces of the LED structure, because the light extraction efficiency is determined mainly by the surface layer or condition of the epitaxial wafers. Consequently, only some aspects (the surface layers) of the LED are shown in all of the figures.

Conventional LED Structures

Figure 1:
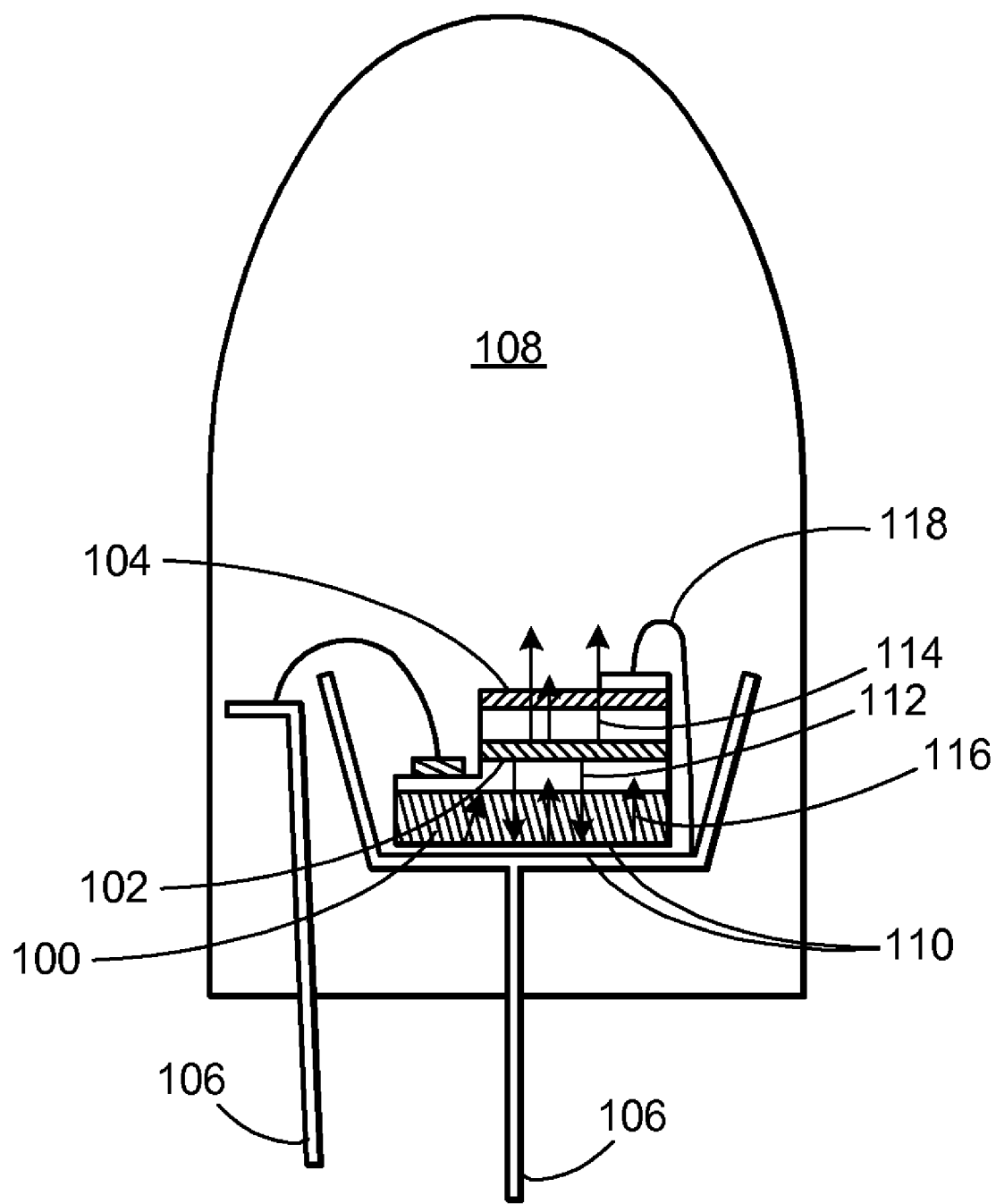
FIGS. 1, 2 and 3 are cross-sectional schematic illustrations of conventional LEDs.
Figure 2:
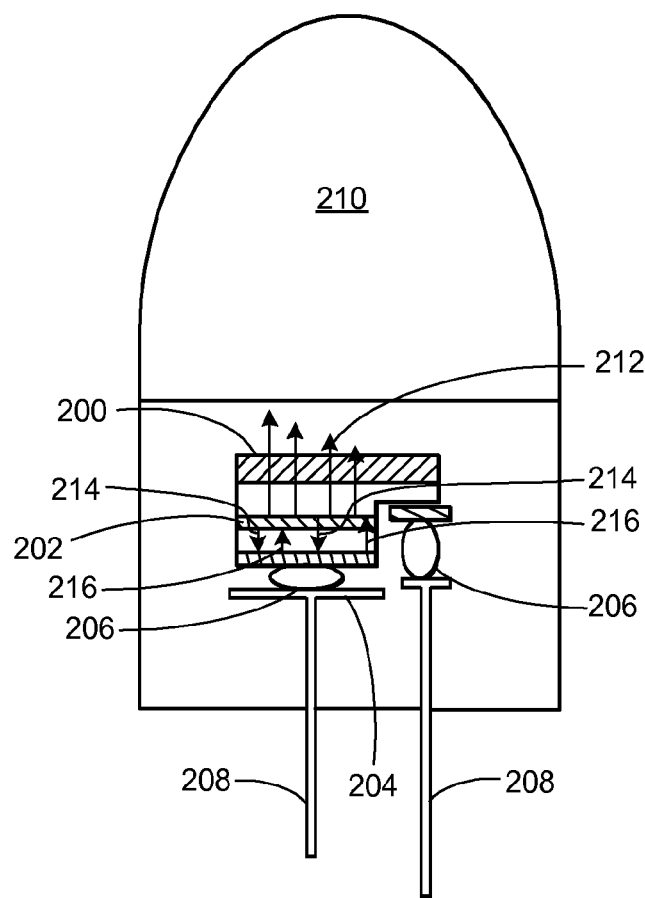
Figure 3:
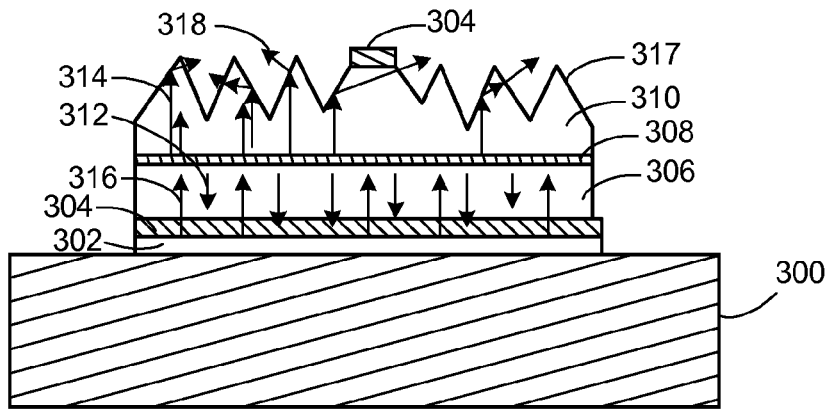

FIGS. 1, 2 and 3 are schematic illustrations of conventional LEDs.

In conventional LEDs, in order to increase the light output power from the front side of the LED, the emitting light is reflected by the mirror on the backside of the sapphire substrate or the mirror coating on the lead frame even if there is no mirrors on the backside of the sapphire substrate and if the bonding material is transparent on the emission wavelength. This reflected light is re-absorbed by the emitting layer (active layer) because the photon energy is almost same as the band-gap energy of the quantum well of AlInGaN multi-quantum well (MQW). Then, the efficiency or output power of the LEDs is decreased due to the re-absorption by the emitting layer.

In FIG. 1, a conventional LED includes a sapphire substrate 100, emitting layer 102 (active layer), and semi-transparent or transparent electrodes 104, such as ITO or ZnO. The LED is die-bonded on a lead frame 106 with a clear epoxy molding 108 without any mirror on the back side of the sapphire substrate 100. In this case, the coating material on the lead frame 106, or the surface of the lead frame 106, becomes a mirror 110. If there is a mirror 110 on the back side of the substrate 100, the LED chip is die-bonded using an Ag paste. The active layer 102 emits light 112 towards the substrate 100 and emits light 114 towards the electrodes 104. The emitting light 112 is reflected by the mirror 110 towards the electrode 104, becoming reflected light 116 which is transmitted by the electrode 104 to escape the LED. The LED is wire bonded 118 to the lead frame 106.

In FIG. 2, the conventional LED is similar to that shown in FIG. 1, except that it is a flip-chip LED. The LED includes a sapphire substrate 200 and emitting layer 202 (active layer), and a highly reflective mirror 204. The LED is die-bonded 206 onto a lead frame 208 and embedded in a clear epoxy molding 210. The active layer 202 emits light 212 towards the substrate 200 and emits light 214 towards the highly reflective mirror 204. The emitting light 214 is reflected by the mirror 204 towards the substrate 200, becoming reflected light 216 which is transmitted by the substrate 200 to escape the LED.

In FIG. 3, the conventional LED includes a conducting sub-mount 300, high reflectivity mirror 302 (with Ag>94% reflectivity (R)), a transparent ITO layer 304, a p-GaN layer 306, an emitting or active layer 308, and an n-GaN layer 310. The LED is shown without the epoxy molding, although similar molding may be used. The emitting layer 308 emits LED emissions 312 towards the mirror 302 and emits LED emissions 314 towards the n-GaN layer 310. The emission 312 of the emitting layer 308 is reflected by the mirror 302, where the reflective light emissions 316 are re-absorbed by the emitting layer 308. The efficiency of the LED is decreased due to this re-absorption. The n-GaN layer may be roughened 317 to enhance extraction 318 of LED emissions 314.

Improved LED Structures

The present invention describes a transparent LED. Generally, the present invention describes a light emitting device comprised of a plurality of III-nitride layers, including an active region that emits light, wherein all of the layers except for the active region are transparent for an emission wavelength of the light, such that the light is extracted effectively through all of the layers and in multiple directions through the layers. The surface of one or more of the III-nitride layers may be roughened, textured, patterned or shaped to enhance light extraction.

Figure 4A:
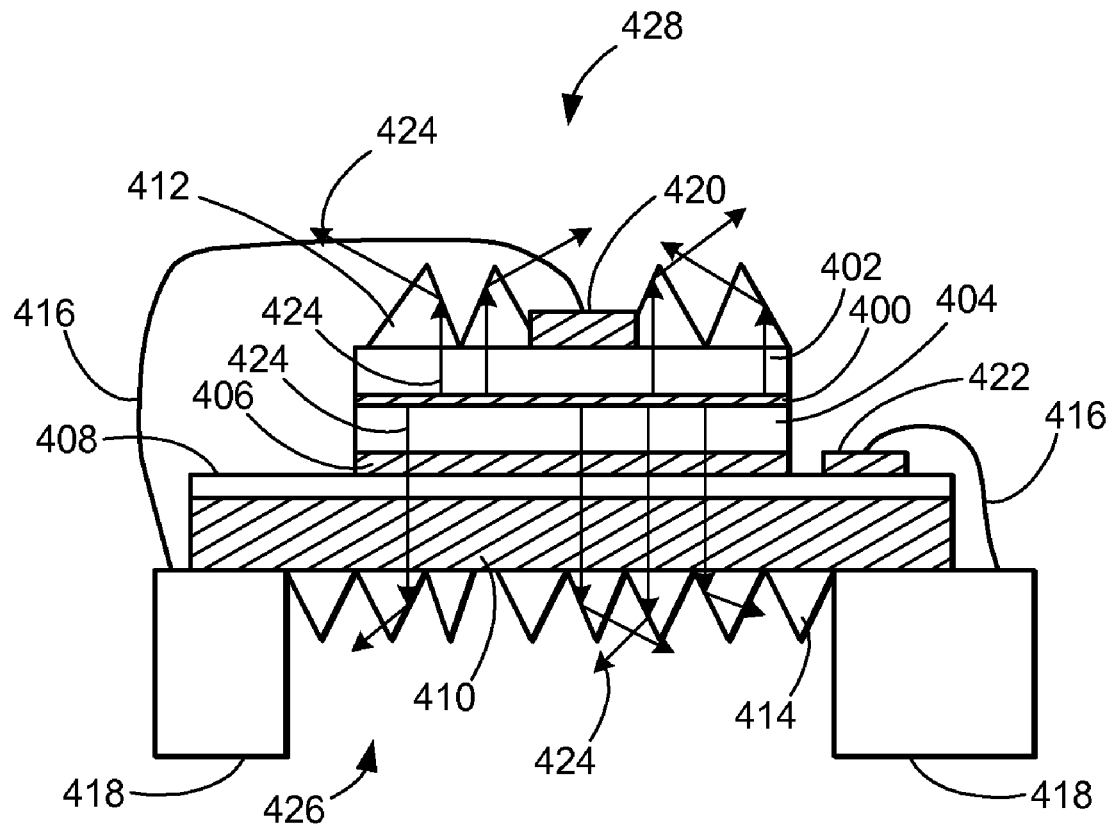
FIGS. 4A and 4B are schematic and plan view illustrations, respectively, of an improved LED structure according to the preferred embodiment of the present invention.
Figure 4B:
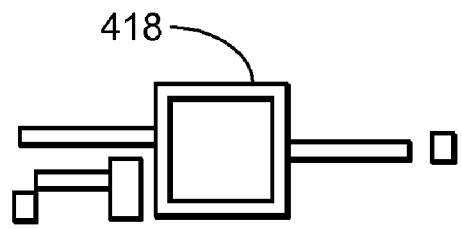

FIG. 4A is a schematic illustrating a specific improved LED structure according the preferred embodiment of the present invention, wherein the improved LED structure comprises an emitting layer 400, an n-type GaN layer 402, a p-type GaN layer 404, a first ITO layer 406, a second ITO layer 408, and a glass layer 410. The n-type GaN layer 402 may have surface 412 that is roughened, textured, patterned or shaped (e.g., a cone shaped surface), and the glass layer 410 may have a surface 414 that is roughened, textured, patterned or shaped (e.g., a cone shaped surface). The LED is wire bonded 416 to a lead frame 418 via bonding pads 420, 422. FIG. 4B shows a top view of the lead frame 418.

In FIG. 4A, the LED structure is grown on a sapphire substrate, which is removed using a laser de-bonding technique. Thereafter, the first ITO layer 406 is deposited on the p-type GaN layer 404. The LED structure is then attached to the glass layer 410, which is coated by the second ITO layer 408, using an epoxy as a glue. The LED structure is then wire bonded 416 to the lead frame 418.

In FIG. 4A, there are no intentional mirrors at the front or back sides of the LED. Instead, the lead frame 418 is designed to effectively extract light 424 from both sides of the LED, because the frame 418 does not obstruct the surfaces 412 and 414, i.e., the back side 426 of the LED as well as the front side 428 of the LED. FIG. 4B shows that the frame 418 supports the LED at the edges of the glass layer 410, leaving the emitting surface of the glass layer 410 and LED unobstructed. Light rays 430 represent light emitted by the emitting layer 400.

An ohmic contact may be placed below the bonding pad 420 on the n-GaN layer 402, but is not shown in the figure for simplicity.

Figure 5A:
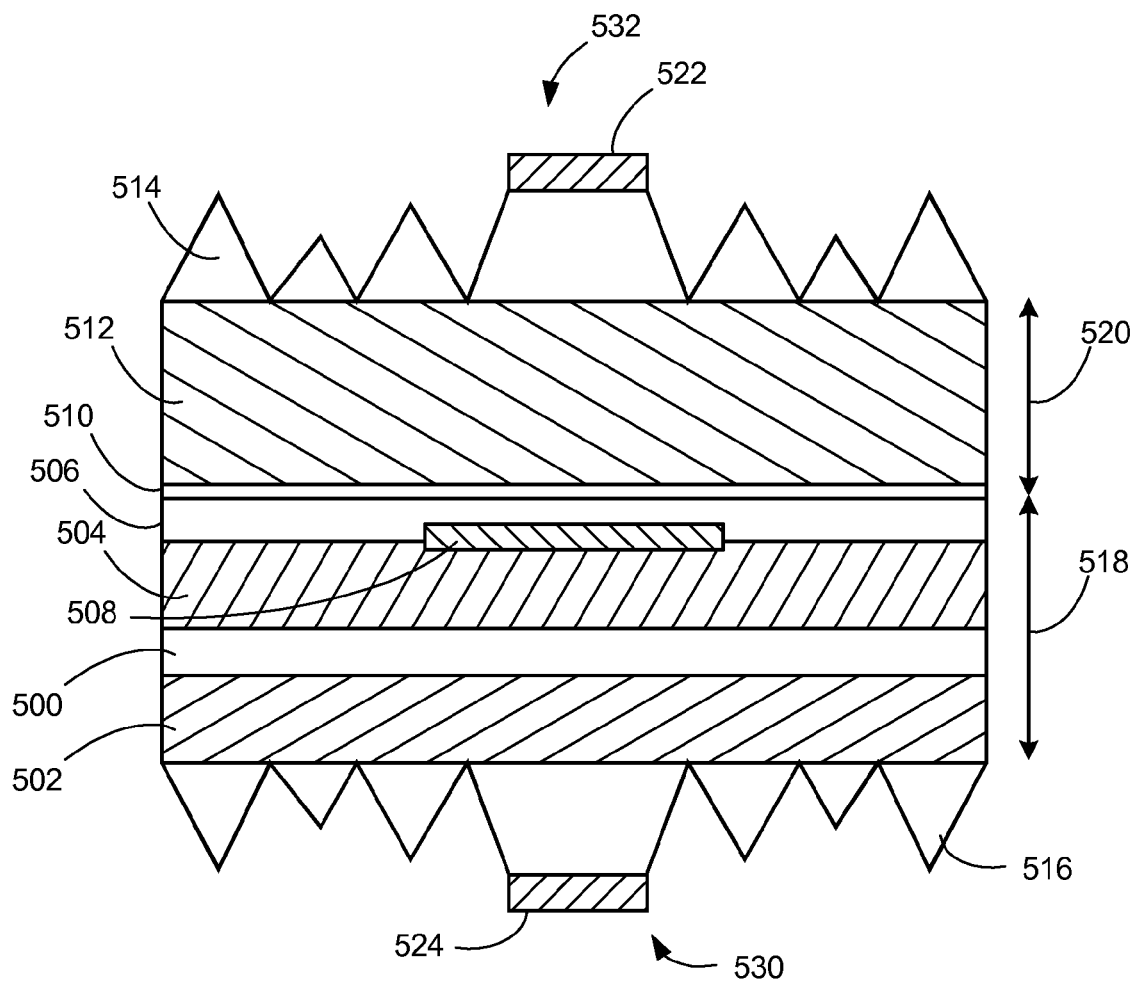
FIGS. 5A and 5B are schematic and plan view illustrations, respectively, of an improved LED structure according to the preferred embodiment of the present invention.

FIG. 5A is a schematic illustrating a specific improved LED structure according the preferred embodiment of the present invention, wherein the improved LED structure comprises an InGaN multiple quantum well (MQW) layer as an emitting layer 500, an n-type GaN layer 502, a p-type GaN layer 504, an ITO or ZnO layer 506, a transparent insulating layer 508, and transparent conductive glue 510 for bonding the ITO or ZnO layer 506 to a transparent conductive substrate 512. The transparent conductive substrate 512 may have a surface 514 that is roughened, textured, patterned or shaped (e.g., a cone shaped surface), and the n-GaN layer 504 may have a surface 516 that is roughened, textured, patterned or shaped (e.g., a cone shaped surface). Preferably, the layers 500, 502, 504 and 506 have a combined thickness 518 of approximately 5 microns, and the substrate 512 and glue 510 have a combined thickness 520 of approximately 400 microns. Finally, ohmic electrode/bonding pads 522, 524 are placed on the LED.

The LED structure may be grown on a sapphire substrate, which is removed using a laser de-bonding technique. The ITO layer 506 is then deposited on the p-type GaN layer 504. Before deposition of the ITO layer 506, the insulating layer 508, which may comprise $SiO_2$ or SiN, is deposited as a current spreading layer. Without the current spreading layer 508, the emission intensity of the LED becomes small due to non-uniform current flows. The transparent conductive substrate 512, which may be ZnO, $Ga_2O_3$, or another material that is transparent at the desired wavelengths, is wafer bonded or glued to the ITO layer 506 using the transparent conductive glue 510. Then, an n-GaN ohmic electrode/bonding pad 522 and an p-GaN ohmic electrode/bonding pad 524 are formed on both sides of the LED structure. Finally, the nitrogen-face (N-face) of the n-type GaN layer 502 is roughened, textured, patterned or shaped 516 to enhance light extraction, for example, using a wet etching, such as KOH or HCL, to form a cone-shaped surface 516.

Figure 5B:
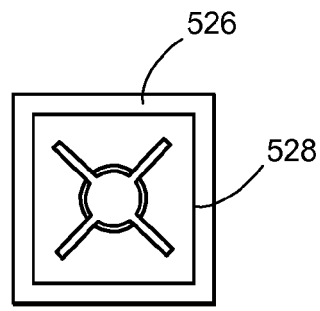

FIG. 5B is a plan view of the LED of FIG. 5A, and shows the LED placed on a transparent plate 526, which resides on a lead frame 528, both of which work to remove heat from the LED. The p-side of the LED (i.e., the side with the substrate 512) is attached to the transparent plate 526. Wire bonding is performed between the bonding pad 524 of the n-type GaN layer 502 and the lead frame 528.

There are no intentional mirrors at the front 530 or back sides 532 of the LED. Instead, the lead frame 528 is designed to effectively extract light from both sides of the LED, i.e., the back side 532 of the LED as well as the front side 530 of the LED.

Finally, an ohmic contact may be placed below the bonding pad 524 of the n-GaN layer 502. However, this ohmic contact is not shown in the figure for simplicity.

Figure 6:
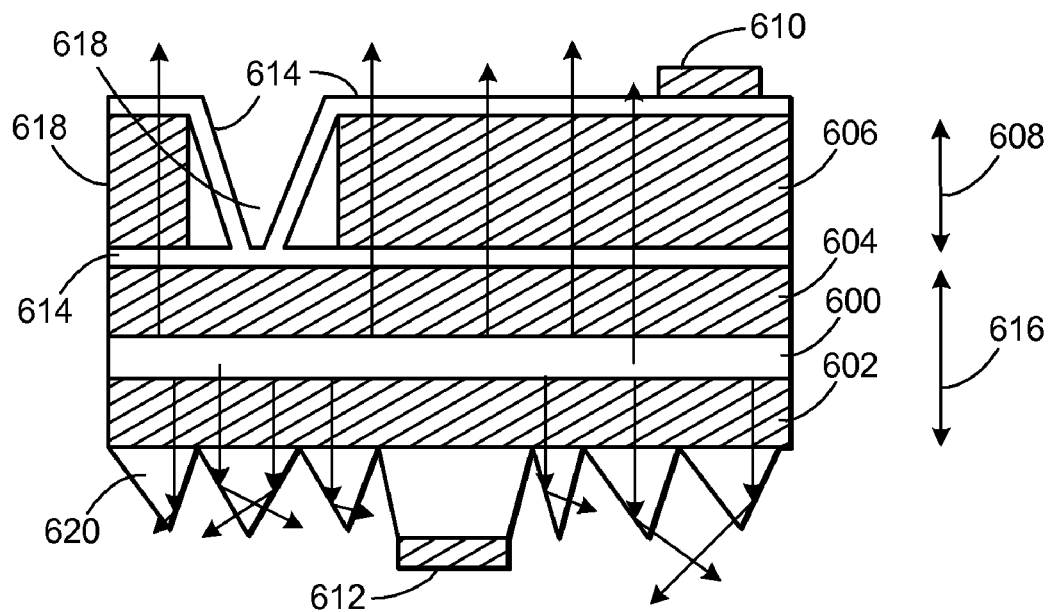
FIG. 6 is a schematic illustration of an improved LED structure according to the preferred embodiment of the present invention.

FIG. 6 is a schematic illustrating a specific improved LED structure according the preferred embodiment of the present invention, wherein the improved LED structure comprises an InGaN MQW active layer 600, an n-GaN layer 602, a p-GaN layer 604, an epoxy layer 606 (which is approximately 400 microns thick 608), a bonding pad 610, an ohmic electrode/bonding pad 612, and an ITO or ZnO layer 614. The combined thickness 616 of the n-GaN layer 602, active layer 600 and p-GaN layer 604 is approximately 5 microns.

Figure 7:
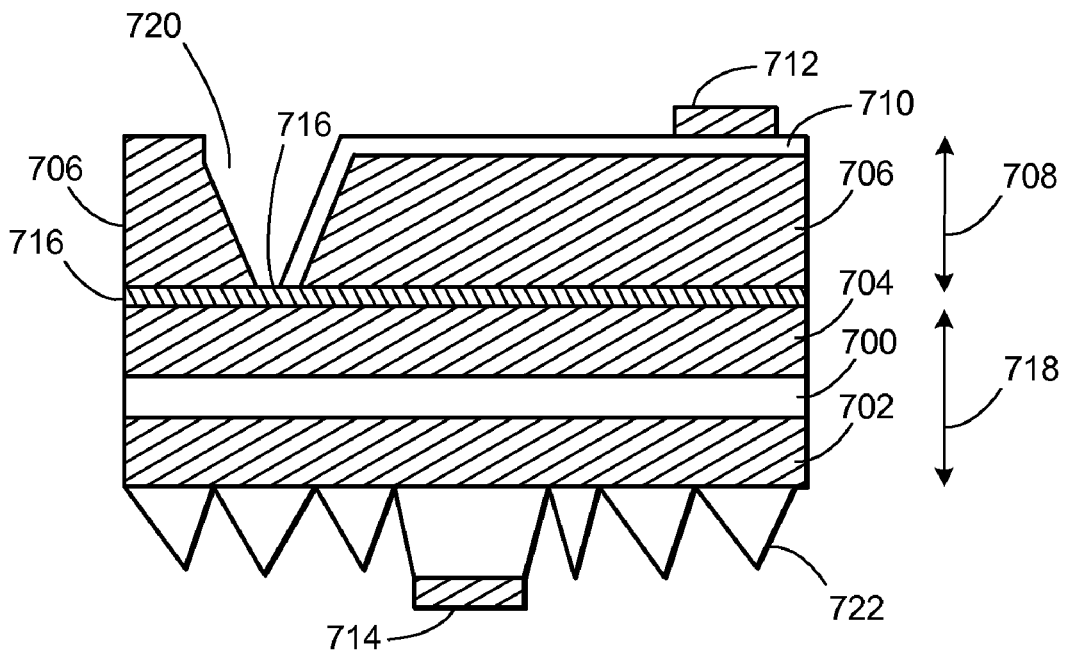
FIG. 7 is a schematic illustration of an improved LED structure according to the preferred embodiment of the present invention.

FIG. 7 is a schematic illustrating a specific improved LED structure according the preferred embodiment of the present invention, wherein the improved LED structure comprises an InGaN MQW active layer 700, an n-GaN layer 702, a p-GaN layer 704, an epoxy layer 706 (approximately 400 microns thick 708), a narrow stripe Au connection 710, a bonding pad 712, an ohmic electrode/bonding pad 714, and ITO or ZnO 716. The thickness 718 of the n-GaN 702, active layer 700 and p-GaN layer 704 is approximately 5 microns.

In both FIGS. 6 and 7, a thick epoxy layer 606, 706 is used, rather than the glass layer 410 shown in FIG. 4. To make electrical contact, the epoxy insulating layers 606, 706 are partially removed, and the ITO layer 614, which is a transparent metal oxide, or a narrow stripe of Au or other metal layer 710, are deposited on the epoxy layers 606, 706, as well as within a hole or depression 618, 720 in the surface of the epoxy layers 606, 706, to make electrical; contact with the p-GaN layer 604, 704.

In addition, both FIGS. 6 and 7 show that roughened, textured, patterned or shaped surfaces 620, 722 are formed on the nitrogen face (N-face) of the n-type GaN layers 602, 702. These roughened, textured, patterned or shaped surfaces 620, 722 enhance light extraction.

Note that, if a GaN substrate is used instead of a sapphire substrate, laser de-bonding would not be required and, a result, the sub-mounts 606, 706 would not be required. Moreover, if the LED structure is created on a GaN substrate, the ITO layer 614 would be deposited on the p-type GaN layer 604 and the backside of the GaN substrate, which is an N-face GaN, could be etched using a wet etching, such as KOH and HCL in order to form surfaces 620, 722 that are roughened, textured, patterned or shaped on the n-type GaN layers 602, 702.

Note also that, if the surface of the ITO layer 614 is roughened, textured, patterned or shaped, light extraction is increased through the ITO layer 614. Even without the ITO layer 614 on the p-type GaN layer 604, the roughening, texturing, patterning or shaping of the surface of the p-type GaN layer 604 is effective to increase the light extraction through the p-type GaN layer 604.

Finally, an ohmic contact for the n-type GaN layer 612, and the ITO or ZnO layer 614 may be used after the surface 620 roughening, texturing, patterning or shaping of the n-type GaN layer 602. The ITO or ZnO layer 614 has a similar refractive index as GaN and, as a result, the light reflection at the interface between the ITO, ZnO and GaN is minimized.

FIG. 8A is a schematic illustrating a specific improved LED structure according the preferred embodiment of the present invention, wherein the improved LED structure comprises an emitting layer 800, an n-type GaN layer 802, a p-type GaN layer 804, a first ITO layer 806, a second ITO layer 808, and a glass layer 810. The n-type GaN layer 802 has a surface 812 that is roughened, textured, patterned or shaped (e.g., a cone shape surface), and the glass layer 810 has a surface 814 that is roughened, textured, patterned or shaped (e.g., a cone shape surface). The LED is wire bonded 816 to a lead frame or sub-mount 818 using the bonding pads 820, 822.

The LED may be embedded with or contained in a molding or shaped optical element 824, such as a sphere made of epoxy or glass, forming, for example, a lens. The shaped optical element 824 may include a phosphor layer 826, which may be remote from the LED, that is roughened, textured, patterned or shaped, for example, on an outer surface of the shaped optical element 824. In this embodiment, the emitting layer 800 emits light 828 towards the surfaces 812 and 814, where the light can be extracted 830.

In this embodiment, because the shaped optical element 824 is a sphere, the LED structure can be considered a small spot light source, because the direction of all of the light emitted from the LED is substantially normal to the interface between air and the sphere 824, and the light therefrom is effectively extracted to air through the interface between air and the sphere 824.

In addition, if the phosphor layer 826 is placed on or near the outer surface of the shaped optical element, the conversion efficiency, for example, from blue light to white light, is increased due to reduced re-absorption of the light 828 resulting from reduced back scattering of the light 828 by the phosphor layer 826. Moreover, if the surface 834 of the phosphor layer 826 is roughened, textured, patterned or shaped, light extraction is again increased.

Finally, FIG. 8B is a top view of the device in FIG. 8A, illustrating the lead frame 818.

FIG. 9 is a schematic illustrating a specific improved LED structure according the preferred embodiment of the present invention, wherein the improved LED structure comprises an InGaN MQW emitting layer 900, an n-type GaN layer 902, a p-type GaN layer 904, an ITO layer 906 having a surface 908 that is roughened, textured, patterned or shaped, a bonding pad 910, an ohmic contact/bonding pad 912, a surface 914 of the n-type GaN layer 902 that is roughened, textured, patterned or shaped, and an epoxy layer 916 that is deposited on the 908. The LED may be embedded with or contained in a molding or shaped optical element 918, such as a sphere made of epoxy or glass, forming, for example, a lens. The shaped optical element 918 may include a phosphor layer 920, which may be remote from the LED, that is roughened, textured, patterned or shaped, for example, on an outer surface of the shaped optical element 918.

In FIG. 9, the ITO or ZnO layer 906 is roughened, textured, patterned or shaped to improve light extraction through the ITO or ZnO layer 906. In addition, the epoxy 918 is sub-mounted. Otherwise, the structure of FIG. 9 is the same as that shown in FIGS. 6-8.

FIG. 10A is a schematic illustrating a specific improved LED structure according the preferred embodiment of the present invention, wherein the improved LED structure comprises an InGaN MQW emitting layer 1000, an n-type GaN layer 1002, a p-type GaN layer 1004, an ITO layer 1006, a bonding pad 1008, an ohmic contact/bonding pad 1010, a surface 1012 of the ITO layer 1006 that is roughened, textured, patterned or shaped, a surface 1014 of the n-type GaN layer 1002 that is roughened, textured, patterned or shaped, and an epoxy layer 1016 that is deposited on the surface 1012.

The LED may be embedded with or contained in a molding or shaped optical element 1018, such as a sphere made of epoxy or glass, forming, for example, a lens. The shaped optical element 1018 may include a phosphor layer 1020, which may be remote from the LED, that is roughened, textured, patterned or shaped, for example, on an outer surface of the shaped optical element 1018.

The LED may also include a current spreading layer 1022, which may comprise SiN, SiO$_2$, or some other insulating material, for example, is deposited before the ITO or ZnO layer 1006 to flow the current uniformly through the p-type GaN layer 1004.

Finally, the LED is wire bonded 1024 to a lead frame 1026. FIG. 10B shows a top view of the lead frame 1026.

FIG. 11 is a schematic illustrating a specific improved LED structure according the preferred embodiment of the present invention, wherein the improved LED structure comprises an InGaN MQW emitting layer 1100, an n-type GaN layer 1102, a p-type GaN layer 1104, an ITO layer 1106, a bonding pad 1108, an ohmic contact/bonding pad 1110, a surface 1112 of the ITO layer 1106 that is roughened, textured, patterned or shaped, a surface 1114 of the p-type GaN layer 1102 that is roughened, textured, patterned or shaped, and an epoxy layer 1116 that is deposited on the surface 1112.

The LED may be embedded with or contained in a molding or shaped optical element 1118, such as a sphere made of epoxy or glass, forming, for example, a lens. The shaped optical element 1118 may include a phosphor layer 1120, which may be remote from the LED, that is roughened, textured, patterned or shaped, for example, on an outer surface of the shaped optical element 1118.

The LED may also include a current spreading layer 1122, which may comprise SiN, SiO$_2$, or some other insulating material, for example, that is deposited before the ITO or ZnO layer 1106 to flow the current uniformly through the p-type GaN layer 1104.

Finally, the LED is wire bonded 1124 to a lead frame 1126. FIG. 11B shows a top view of the lead frame 1126.

In the embodiment of FIG. 11, a mirror 1128 is placed outside of the shaped optical element 1118, in order to obtain more light from a front side 1130 of the device. The shape of the mirror is designed to prevent reflected light from reaching the LED, in order to reduce re-absorption of the light by the LED.

Figure 12A:
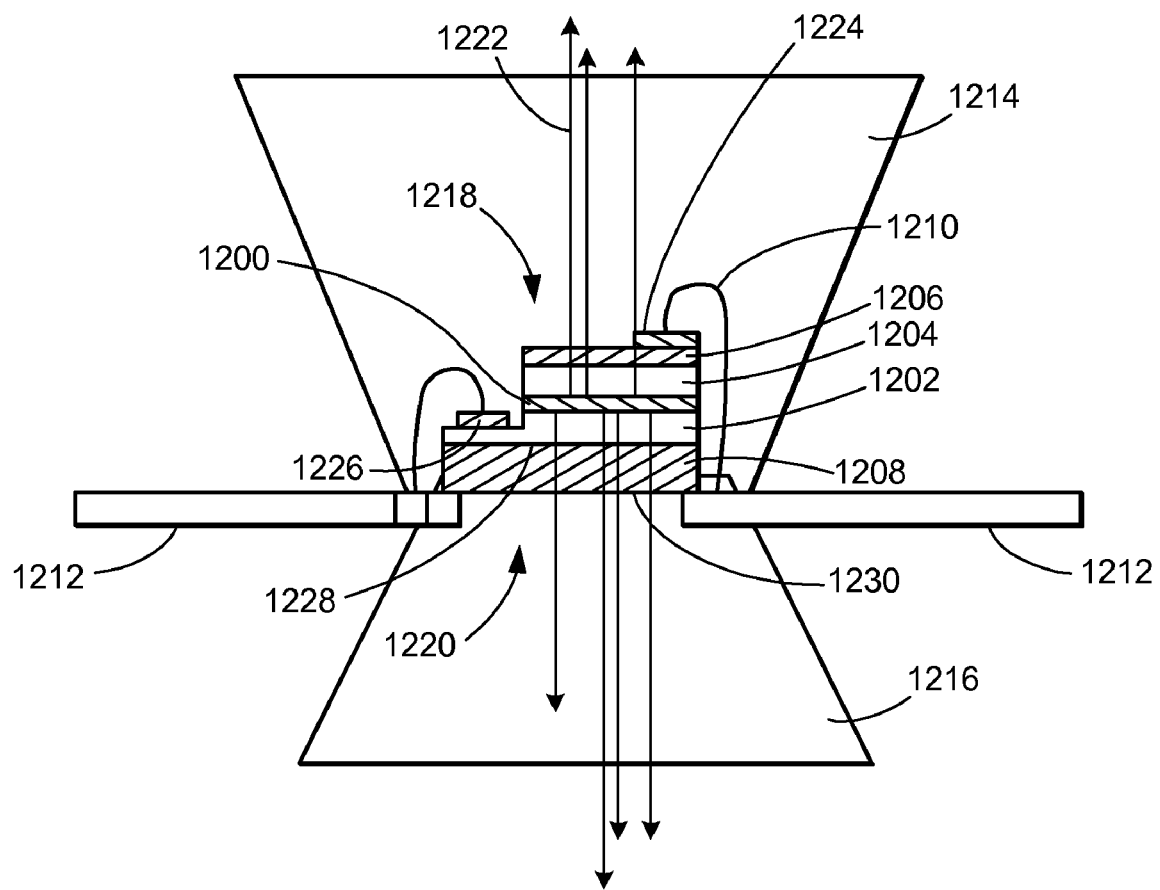
FIGS. 12A and 12B are schematic and plan view illustrations, respectively, of an improved LED structure according to the preferred embodiment of the present invention.

FIG. 12A is a schematic illustrating a specific improved LED structure according the preferred embodiment of the present invention, wherein the improved LED structure comprises an emitting layer 1200, an n-type GaN layer 1202, a p-type GaN layer 1204, an ITO or ZnO layer 1206, and a substrate 1208, which may be a flat sapphire substrate or a patterned sapphire substrate (PSS). The LED is wire bonded 1210 to a lead frame 1212, and embedded in or combined with moldings or shaped optical elements 1214, 1216, such as inverted cone shapes made of epoxy or glass, forming, for example, lenses. In this embodiment, the shaped optical elements 1214, 1216 are formed on opposite sides, e.g., the top/front and bottom/back sides of the LED, wherein the emitting layer 1200 emits light 1222 that is extracted from both the top/front and bottom/back sides of the LED.

The LED is electrically connected to the lead frame 1218 via bonding pads 1224, 1226. The bonding pad 1224 is deposited on the ITO or ZnO layer 1206, and the ohmic contact/bonding pad 1226 is deposited on the n-type GaN layer 1202 after the n-type GaN 1202 layer is exposed by a selective etch through the p-type GaN layer 1204.

As noted above, the LED may be combined with epoxy or glass and molded as an inverted cone-shapes 1214, 1216 for both the front 1218 and back sides 1220, wherein the inverted cone molding shape 1214, 1216 provides enhanced light extraction. Specifically, most of the light entering the inverted cone shapes 1214, 1216 lies within a critical angle and is extracted. The light is reflected to a top or emitting surface of the inverted cone shape 1214 by the side walls of the inverted cone shape 1214 for emission through the top surface of the inverted cone shape 1214, and similarly, the light is reflected to a bottom or emitting surface of the inverted cone shape 1216 by the side walls of the inverted cone shape 1216 for emission through the bottom surface of the inverted cone shape 1214.

Finally, note that a patterned sapphire substrate (PSS) 1208 improves the light extraction efficiency through the interface 1228 between the n-GaN layer 1202 and the substrate 1208. In addition, the backside 1230 of the sapphire substrate 1208 may be roughened, textured, patterned or shaped (e.g., a cone shaped surface) to increase the light extraction efficiency.

Figure 12B:
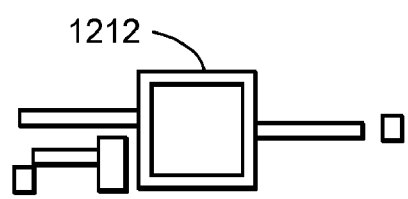

FIG. 12B shows a top view of the lead frame 1212.

Figure 13:
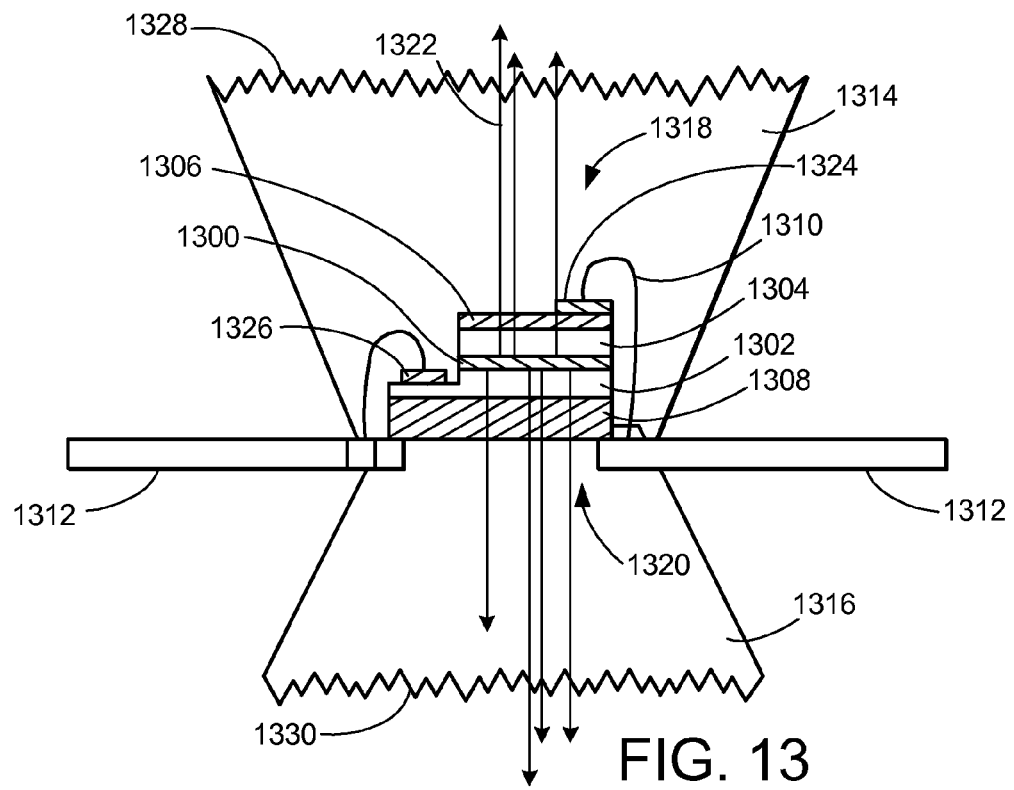
FIG. 13 is a schematic illustration of an improved LED structure according to the preferred embodiment of the present invention.

FIG. 13 is a schematic illustrating a specific improved LED structure according the preferred embodiment of the present invention, wherein the improved LED structure comprises an emitting layer 1300, an n-type GaN layer 1302, a p-type GaN layer 1304, an ITO or ZnO layer 1306, and a substrate 1308, which may be a flat sapphire substrate or a patterned sapphire substrate (PSS). The LED is wire bonded 1310 to a lead frame 1312, and embedded in or combined with moldings or shaped optical elements 1314, 1316, such as inverted cone shapes made of epoxy or glass, forming, for example, lenses. In this embodiment, the shaped optical elements 1314, 1316 are formed on opposite sides, e.g., the top/front and bottom/back sides of the LED, wherein the emitting layer 1300 emits light 1322 that is extracted from both the top/front and bottom/back sides of the LED.

The LED is electrically connected to the lead frame 1318 via bonding pads 1324, 1326. The bonding pad 1324 is deposited on the ITO or ZnO layer 1306, and the ohmic contact/bonding pad 1326 is deposited on the n-type GaN layer 1302 after the n-type GaN 1302 layer is exposed by a selective etch through the p-type GaN layer 1304.

As noted above, the LED may be combined with epoxy or glass and molded as an inverted cone-shapes 1314, 1316 for both the front 1318 and back sides 1320, wherein the inverted cone molding shape 1314, 1316 provides enhanced light extraction. Specifically, most of the light entering the inverted cone shapes 1314, 1316 lies within a critical angle and is extracted. The light is reflected to a top or emitting surface of the inverted cone shape 1314 by the side walls of the inverted cone shape 1314 for emission through the top surface of the inverted cone shape 1314, and similarly, the light is reflected to a bottom or emitting surface of the inverted cone shape 1316 by the side walls of the inverted cone shape 1316 for emission through the bottom surface of the inverted cone shape 1314. Moreover, the top/front surface 1328 of the shaped optical elements 1314, and the bottom/back surface 1330 of the shaped optical element 1316 may be roughened, textured, patterned, or shaped to increase the light extraction through the elements 1314, 1316.

Figure 14:
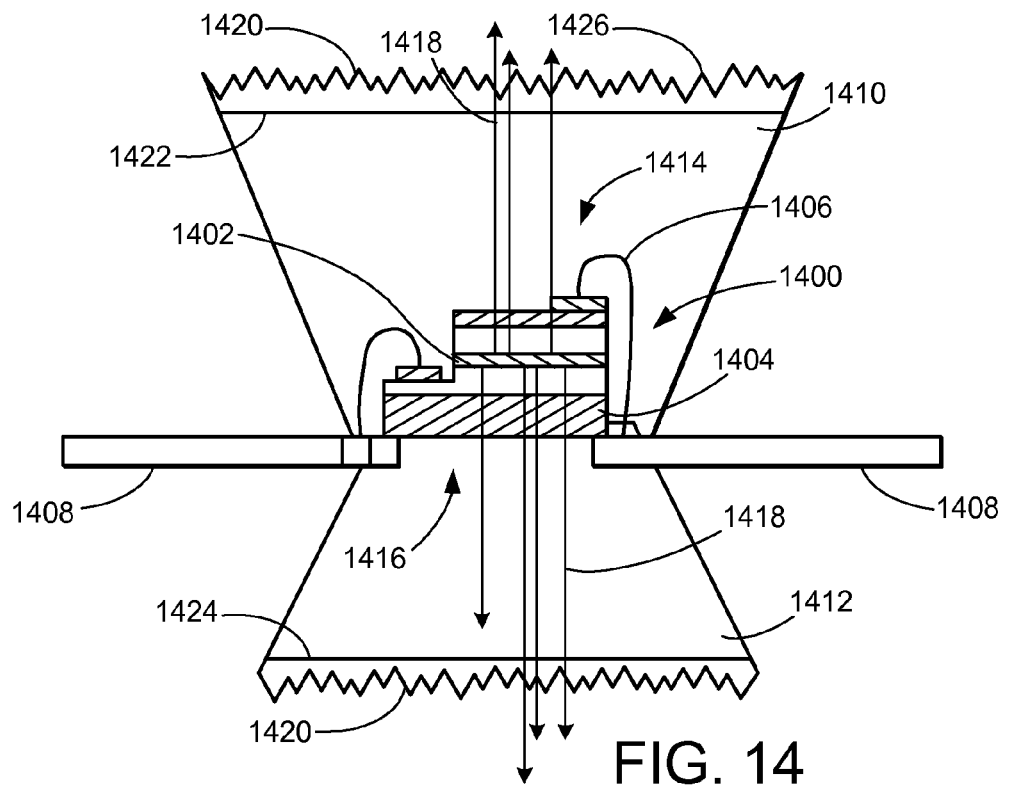
FIG. 14 is a schematic illustration of an improved LED structure according to the preferred embodiment of the present invention.

FIG. 14 is a schematic illustrating a specific improved LED structure according the preferred embodiment of the present invention, wherein the improved LED structure 1400 includes an emitting layer 1402 and a substrate 1404 (as well as other layers), and the substrate 1404 is a flat or patterned sapphire substrate. The LED 1400 is wire bonded 1406 to a lead frame 1408, and embedded in or combined with moldings or shaped optical elements 1410, 1412, such as inverted cone shapes made of epoxy or glass, forming, for example, lenses. In this embodiment, the shaped optical elements 1410, 1412 are formed on opposite sides, e.g., the top/front side 1414 and bottom/back side 1416 of the LED 1400, wherein the emitting layer 1402 emits light 1418 that is extracted from both the top/front side 1414 and bottom/back side 1416 of the LED 1400.

In FIG. 14, phosphor layers 1420 may be placed near the top/front surface 1422 of the shaped optical element 1410 and the bottom/back surface 1424 of the shaped optical element 1412. Preferably, the phosphor layers 1420 should be positioned as far away as possible from the LED 1400. In this case, the conversion efficiency of the blue light to white light is increased, due to reduced re-absorption of the emitted light by the LED 1400 resulting from reduced back-scattering of the light by the phosphor layers 1420 to the LED 1400. Moreover, the surfaces 1426 of the phosphor layers 1420 may be roughened, textured, patterned or shaped to improve light extraction.

Figure 15A:
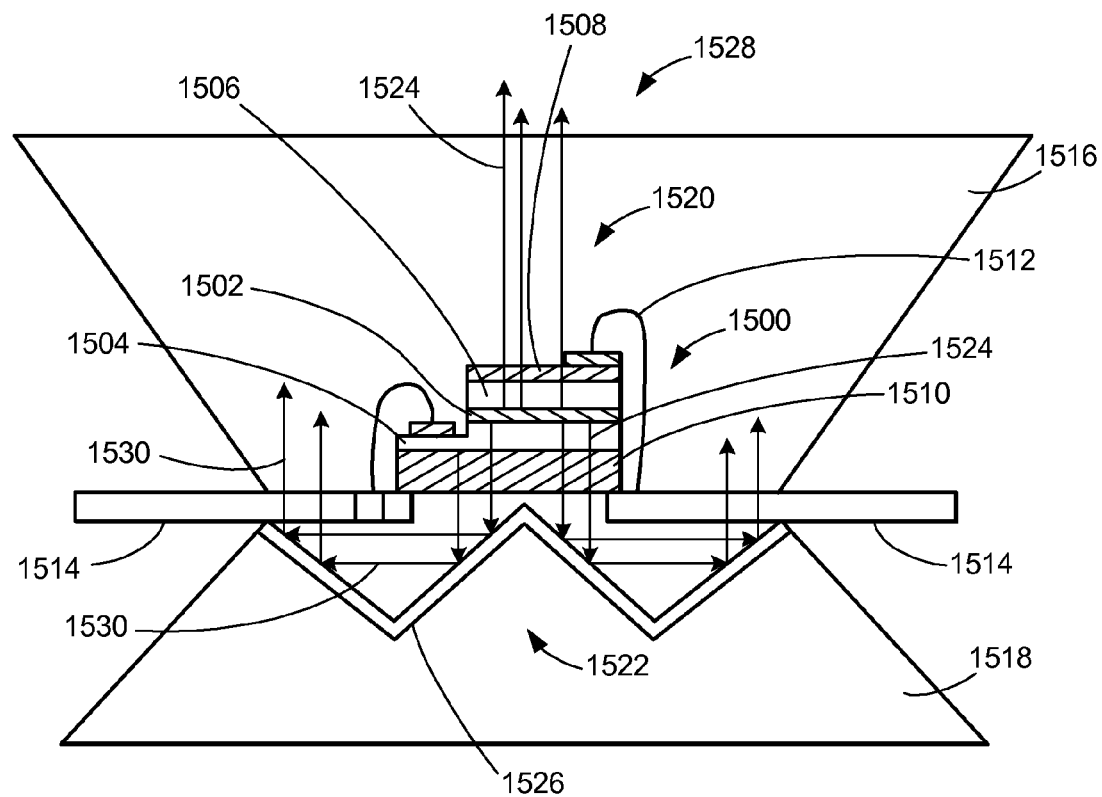
FIGS. 15A and 15B are schematic and plan view illustrations, respectively, of an improved LED structure according to the preferred embodiment of the present invention.

FIG. 15A is a schematic illustrating a specific improved LED structure according the preferred embodiment of the present invention, wherein the improved LED structure 1500 comprises an emitting layer 1502, an n-type GaN layer 1504, a p-type GaN layer 1506, an ITO or ZnO layer 1508, and a substrate 1510, which may be a flat sapphire substrate or a patterned sapphire substrate (PSS).

Figure 15B:
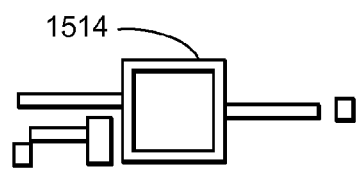

The LED 1500 is wire bonded 1512 to a lead frame 1514, wherein FIG. 15B is a schematic illustration showing the top view of the lead frame 1514.

In this embodiment, the LED 1500 is embedded in or combined with moldings or shaped optical elements 1516, 1518, such as inverted cone shapes made of epoxy or glass, forming, for example, lenses. The shaped optical elements 1516, 1518 are formed on opposite sides, e.g., the top/front side 1520 and bottom/back side 1522 of the LED 1500, wherein the emitting layer 1502 emits light 1524 that is extracted from both the top/front side 1520 and bottom/back side 1522 of the LED 1500.

A mirror 1526 may be placed inside the shaped optical element 1518 to increase the light output to the front side 1528 of the LED 1500. Moreover, the shape of the mirror 1526 is designed to prevent reflections of the light 1530 emitted from the LED 1500 from being re-absorbed by the LED 1500, which would reduce the output power or the efficiency of the LED. Instead, the mirror 1526 guides the reflected light 1530 away from the LED 1500.

In addition, the mirror 1526 is only partially attached (or not attached at all) to the LED 1500 or the substrate 1510. This differs from conventional LEDs, where mirrors are attached to the entire surface of the LED, for example, as shown in FIGS. 1-3.

Figure 16:
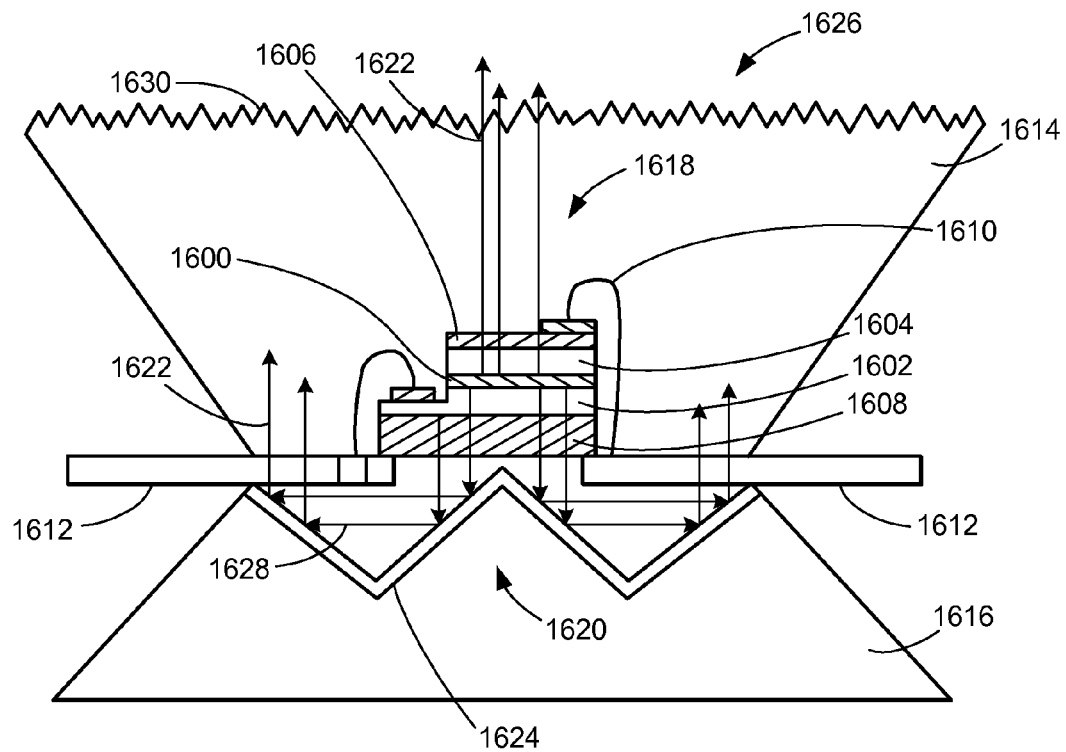
FIG. 16 is a schematic illustration of an improved LED structure according to the preferred embodiment of the present invention.

FIG. 16 is a schematic illustrating a specific improved LED structure according the preferred embodiment of the present invention, wherein the improved LED structure comprises an emitting layer 1600, an n-type GaN layer 1602, a p-type GaN layer 1604, an ITO or ZnO layer 1606, and a substrate 1608, which may be a flat sapphire substrate or a patterned sapphire substrate (PSS). The LED is wire bonded 1610 to a lead frame 1612.

In this embodiment, the LED is embedded in or combined with moldings or shaped optical elements 1614, 1616, such as inverted cone shapes made of epoxy or glass, forming, for example, lenses. The shaped optical elements 1614, 1616 are formed on opposite sides, e.g., the top/front side 1618 and bottom/back side 1620 of the LED, wherein the emitting layer 1602 emits light 1622 that is extracted from both the top/front side 1618 and bottom/back side 1620 of the LED.

A mirror 1624 may be placed inside the shaped optical element 1616 to increase the light output to the front side 1626 of the LED. Moreover, the shape of the mirror 1624 is designed to prevent reflections of the light 1628 emitted from the LED from being re-absorbed by the LED, which would reduce the output power or the efficiency of the LED. Instead, the mirror 1624 guides the reflected light 1628 away from the LED.

In addition, the mirror 1624 is only partially attached (or not attached at all) to the LED or the substrate 1608. This differs from conventional LEDs, where mirrors are attached to the entire surface of the LED, for example, as shown in FIGS. 1-3.

Finally, the top/front surface 1630 of the shaped optical element 1614 is roughened, textured, patterned or shaped to improve light extraction efficiency.

Figure 17:
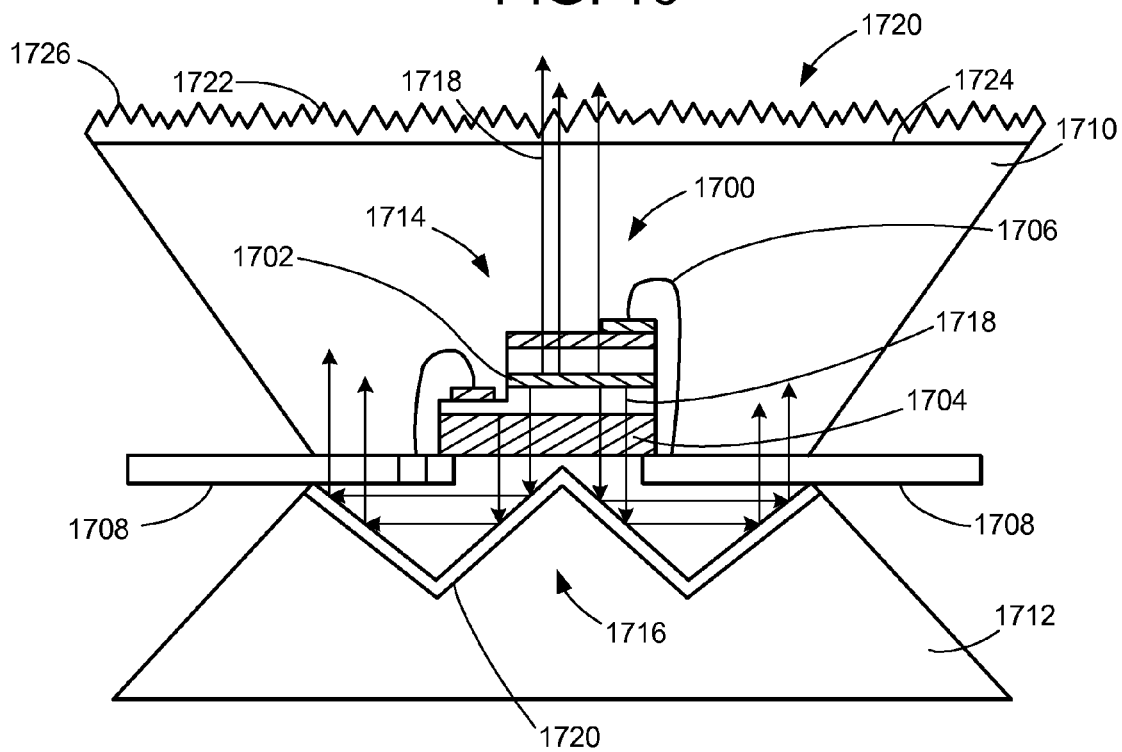
FIG. 17 is a schematic illustration of an improved LED structure according to the preferred embodiment of the present invention.

FIG. 17 is a schematic illustrating a specific improved LED structure according the preferred embodiment of the present invention, wherein the improved LED structure 1700 includes an emitting layer 1702 and a substrate 1704 (as well as other layers), and the substrate 1704 is a flat or patterned sapphire substrate. The LED 1700 is wire bonded 1706 to a lead frame 1708, and embedded in or combined with moldings or shaped optical elements 1710, 1712, such as inverted cone shapes made of epoxy or glass, forming, for example, lenses. In this embodiment, the shaped optical elements 1710, 1712 are formed on opposite sides, e.g., the top/front side 1714 and bottom/back side 1716 of the LED 1700, wherein the emitting layer 1702 emits light 1718 that is extracted from both the top/front side 1714 and bottom/back side 1716 of the LED 1700.

In FIG. 17, a mirror 1720 may be placed inside the shaped optical element 1712 to increase the light output directed to the front side 1720 of the LED 1700. Moreover, a phosphor layer 1722 may be placed near the top surface 1724 of the shaped optical element 1710. Preferably, the phosphor layer 1722 is positioned as far away as possible from the LED 1700. In this case, the conversion efficiency of the blue light to white light is increased, due to reduced re-absorption of the light 1718 emitted from the LED 1700 resulting from reduced back-scattering by the phosphor layer 1722. In addition, the surface 1726 of the phosphor layer 1722 may be roughened, textured, patterned or shaped to improve light extraction through the phosphor layer 1722.

FIG. 18A is a schematic illustrating a specific improved LED structure according the preferred embodiment of the present invention, wherein the improved LED structure 1800 includes an emitting layer 1802 and a substrate 1804 (as well as other layers). The LED 1800 is wire bonded 1806 to a lead frame 1808, wherein FIG. 18B is an illustration showing the top view of the lead frame 1808.

In this embodiment, the LED 1800 is embedded in or combined with a molding or shaped optical element 1810, such as an inverted cone shape made of epoxy or glass, forming, for example, a lens. Light 1812 emitted by the emitting layer 1802 is reflected by mirrors 1814 positioned within the shaped optical element 1810, towards the front side 1816 of the shaped optical element 1810, away from the back side 1818 of the shaped optical element 1810, wherein the reflected light 1820 is output from the shaped optical element 1810.

FIG. 19A is a schematic illustrating a specific improved LED structure according the preferred embodiment of the present invention, wherein the improved LED structure 1900 includes an emitting layer 1902 and a substrate 1904 (as well as other layers). The LED 1900 is wire bonded 1906 to a lead frame 1908, wherein FIG. 19B is an illustration showing the top view of the lead frame 1908.

In this embodiment, the LED 1900 is embedded in or combined with a molding or shaped optical element 1910, such as an inverted cone shape made of epoxy or glass, forming, for example, a lens. Light 1912 emitted by the emitting layer 1902 is reflected by the sidewalls 1914 of the shaped optical element 1910, towards the front side 1916 of the shaped optical element 1910, wherein the reflected light 1918 is output from the shaped optical element 1910, and away from the back side 1920 of the shaped optical element 1910.

Preferably, the LED 1900 is positioned within the shaped optical element 1910 such that the light 1912 emitted by the LED is reflected by mirrored surfaces 1922 of the sidewalls 1914, wherein the mirrored surfaces 1922 are deposited or attached to the sidewalls 1914. The angle 1924 of the sidewalls 1914 relative to the base 1920 of the shaped optical element 1910 is a critical angle that reflects the light 1912 emitted from the LED 1900 to the front side 1916 of the shaped optical element 1910. For example, the refractive index of epoxy is $n_2=1.5$, the refractive index of the air is $n_1=1$, and, as a result, the critical angle of the reflection is $\sin^{-1}(1⅓)$. Therefore, the angle 1924 of the sidewalls 1914 should be more than $\sin^{-1}(1⅓)$. This results in the reflected light 1912 from the LED 1900 being effectively extracted from the top surface 1928 of the shaped optical element in the direction labeled by 1926.

Figures 20A, 20B:
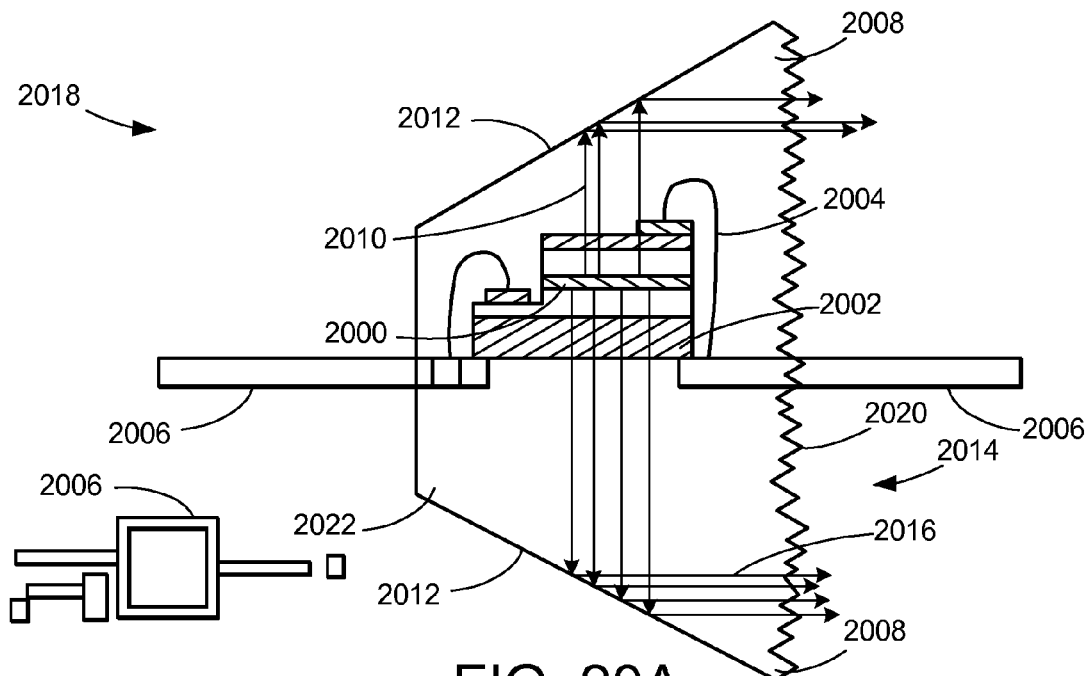
FIGS. 20A and 20B are schematic and plan view illustrations, respectively, of an improved LED structure according to the preferred embodiment of the present invention.

FIG. 20A is a schematic illustrating a specific improved LED structure according the preferred embodiment of the present invention, wherein the improved LED structure includes an emitting layer 2000 and a substrate 2002 (as well as other layers). The LED is wire bonded 2004 to a lead frame 2006, wherein FIG. 20B is a top view of the lead frame 2006.

In this embodiment, the LED is embedded in or combined with a molding or shaped optical element 2008, such as an inverted cone shape made of epoxy or glass, forming, for example, a lens. Light 2010 emitted by the emitting layer 2002 is reflected by the sidewalls 2012 of the shaped optical element 2008, towards the front side 2014 of the shaped optical element 2008, wherein the reflected light 2016 is output from the shaped optical element 2008, and away from the back side 2018 of the shaped optical element 2008.

Preferably, the LED is positioned within the shaped optical element 2008 such that the light 2010 emitted by the LED is reflected by the sidewalls 2012. Moreover, the front or top surface 2020 of the shaped optical element 2008 is roughened, textured, patterned or shaped to increase light extraction.

The angle 2022 of the sidewalls 2012 relative to the base 2018 of the shaped optical element 2008 is a critical angle that reflects the 2010 emitted from the LED to the front side 2014 of the shaped optical element 2008. For example, the refractive index of epoxy is $n_2=1⅓$, the refractive index of the air is $n_1=1$, and, as a result, the critical angle of the reflection is $\sin^{-1}(1⅓)$. Therefore, the angle 2022 of the sidewalls 2012 should be more than $\sin^{-1}(1/5)$. This results in the reflected light 2010 from the LED being effectively extracted from the front surface 2020 of the shaped optical element 2008.

Figures 21A, 21B:
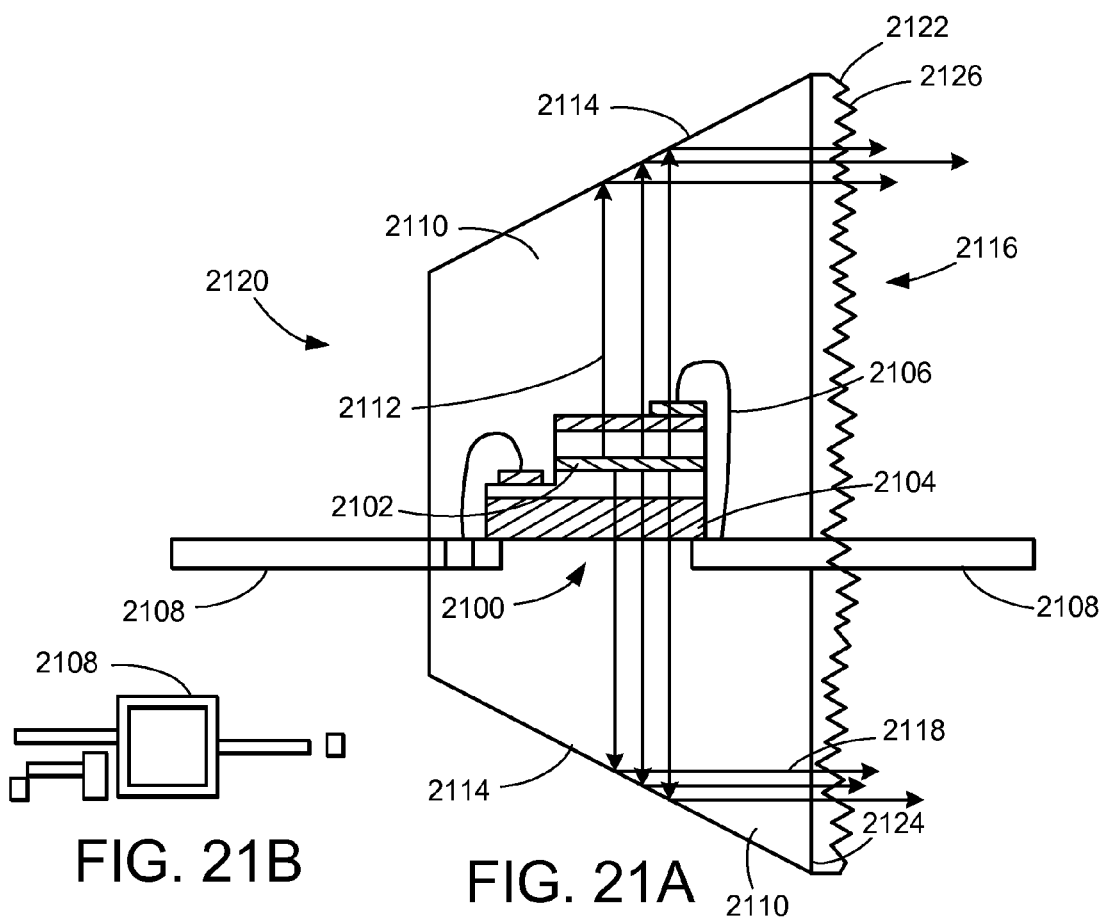
FIGS. 21A and 21B are schematic and plan view illustrations, respectively, of an improved LED structure according to the preferred embodiment of the present invention.

FIG. 21A is a schematic illustrating a specific improved LED structure according the preferred embodiment of the present invention, wherein the improved LED structure 2100 includes an emitting layer 2102 and a substrate 2104 (as well as other layers). The LED 2100 is wire bonded 2106 to a lead frame 2108, wherein FIG. 21B shows a top view of the lead frame 2108.

In this embodiment, the LED 2100 is embedded in or combined with a molding or shaped optical element 2110, such as an inverted cone shape made of epoxy or glass, forming, for example, a lens. Preferably, the LED 2100 is positioned within the shaped optical element 2110 such that the light 2112 emitted by the LED is reflected by the sidewalls 2114 of the shaped optical element 2110, towards the front side 2116 of the shaped optical element 2110, wherein the reflected light 2118 is output from the shaped optical element 2110, and away from the back side 2120 of the shaped optical element 2110.

A phosphor layer 2122 may be placed on or near the front or top surface 2124 of the shaped optical element 2110. Preferably, the phosphor layer 2122 is placed as far away as possible from the LED 2100. In this example, the conversion efficiency of blue light to white light is increased due to reduced re-absorption of the light 2112 by the LED 2100 resulting from reduced back-scattering by the phosphor layer 2122. In addition, the surface 2126 of the phosphor layer 2122 may be roughened, textured, patterned or shaped to increase light extraction.

Figure 22A:
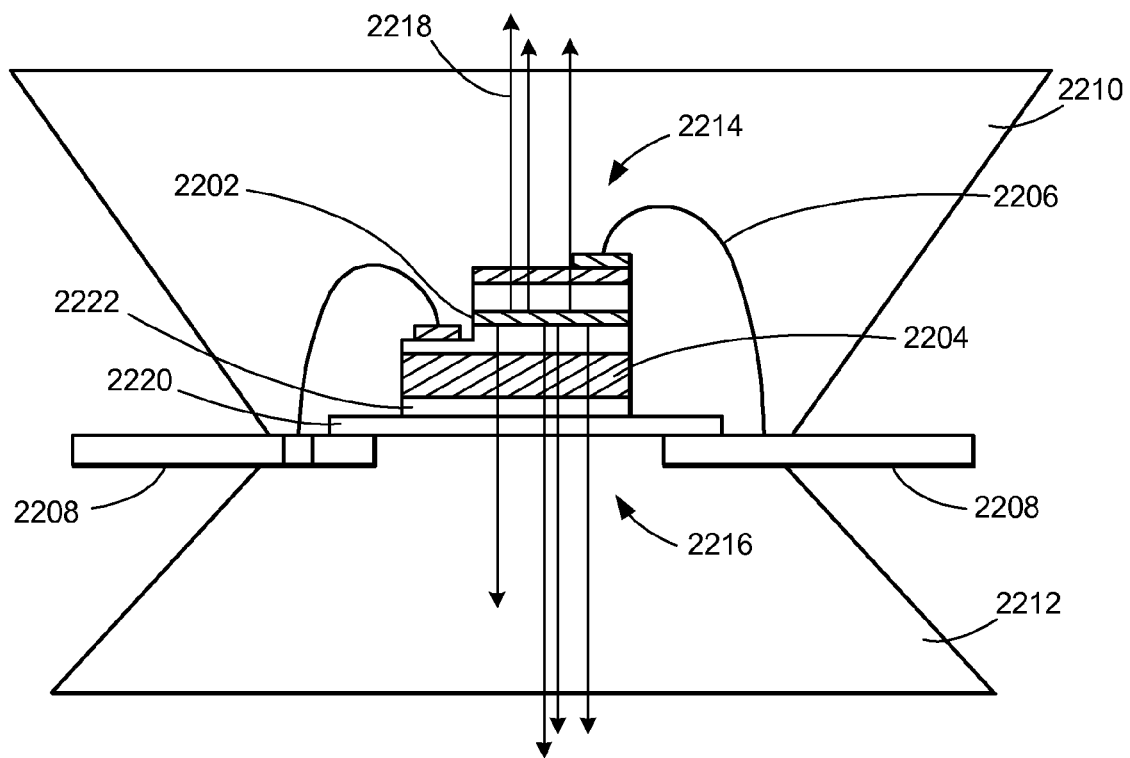
FIGS. 22A and 22B are schematic and plan view illustrations, respectively, of an improved LED structure according to the preferred embodiment of the present invention.
Figure 22B:
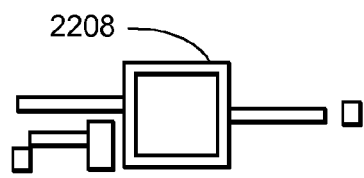

FIG. 22A is a schematic illustrating a specific improved LED structure according the preferred embodiment of the present invention, wherein the improved LED structure 2200 includes an emitting layer 2202 and a substrate 2204 (as well as other layers). The LED 2200 is wire bonded 2206 to a lead frame 2208, wherein FIG. 22B shows a top view of the lead frame 2208.

The LED 2200 is embedded in or combined with moldings or shaped optical elements 2210, 2212, such as inverted cone shapes made of epoxy or glass, forming, for example, lenses. In this embodiment, the shaped optical elements 2210, 2212 are formed on opposite sides, e.g., the top/front side 2214 and bottom/back side 2216 of the LED 2200, wherein the emitting layer 2200 emits light 2218 that is extracted from both the top/front side 2214 and bottom/back side 2216 of the LED 2200.

The lead frame 2208 includes a transparent plate 2220, wherein the LED 2200 is bonded to the transparent plate 2220 using a transparent/clear epoxy 2222 as a die-bonding material. The transparent plate 2220 may be comprised of glass, quartz, sapphire, diamond or other material transparent for the desired emission wavelength, wherein the transparent glass plate 2220 effectively extracts the light 2218 emitted from the LED 2200 to the shaped optical element 2212.

Advantages and Improvements

One advantage of the present invention is that all of the layers of the LED are transparent for the emission wavelength, except for the emitting layer, such that the light is extracted effectively through all of the layers.

Moreover, by avoiding the use of intentional mirrors with the LED, re-absorption of light by the LED is minimized, light extraction efficiency is increased, and light output power is increased.

The combination of a transparent electrode with roughened, textured, patterned or shaped surfaces, with the LED embedded within a shaped optical element or lens, results in increased light extraction.

References

The following references are incorporated by reference herein:
1. Appl. Phys. Lett., 56, 737-39 (1990).
2. Appl. Phys. Lett., 64, 2839-41 (1994).
3. Appl. Phys. Lett., 81, 3152-54 (2002).
4. Jpn. J. Appl. Phys., 43, L1275-77 (2004).
5. Jpn. J. Appl. Phys., 45, L1084-L1086 (2006).
6. Jpn. J. Appl. Phys., 34, L797-99 (1995).
7. Jpn. J. Appl. Phys., 43, L180-82 (2004).
8. Fujii T., Gao Y., Sharma R., Hu E. L., DenBaars S. P., Nakamura S., "Increase in the extraction efficiency of GaN-based light-emitting diodes via surface roughening," Applied Physics Letters, vol. 84, no. 6, 9 Feb. 2004, pp. 855-7.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

What is claimed is:

1. A device, comprising:
a light emitting diode (LED) including a plurality of III-nitride layers, wherein:
the plurality of the III-nitride layers include an n-type layer, a p-type layer, and an active region between the n-type layer and the p-type layer that emits light, and
an n-type side of the LED is on a front side of the LED, and a p-type side of the LED is on a back side of the LED opposite the front side;
a transparent substrate or sub-mount attached to the p-type side of the III-nitride layers only; and
one or more shaped optical elements combined with the LED and the transparent substrate or sub-mount, wherein the shaped optical elements and the transparent substrate or sub-mount extract light from the LED, such that the light is extracted through at least the front side and the back side of the LED.

2. The device of claim 1, wherein one or more transparent conducting layers are positioned to electrically connect the III-nitride layers.

3. The device of claim 2, wherein one or more current spreading layers are deposited on the III-nitride layers, and the transparent conducting layers are deposited on the current spreading layers.

4. The device of claim 1, without mirrors or mirrored surfaces on the front side or the back side of the LED.

5. The device of claim 1, wherein a surface of one or more of the III-nitride layers is roughened, textured, patterned or shaped to enhance light extraction.

6. The device of claim 1, wherein a lead frame supports the III-nitride layers and the light emitted from the III-nitride layers is transmitted through the lead frame.

7. The device of claim 6, wherein the III-nitride layers reside on a transparent plate in the lead frame, and the light emitted from the III-nitride layers is transmitted through the transparent plate in the lead frame.

8. The device of claim 1, wherein the III-nitride layers are embedded in the shaped optical elements, and the light is extracted from a plurality of surfaces of the III-nitride layers before entering the shaped optical elements and subsequently being extracted.

9. The device of claim 8, wherein at least a portion of the light entering the shaped optical elements lies within a critical angle and is extracted.

10. The device of claim 8, wherein one or more surfaces of the shaped optical elements are roughened, textured, patterned or shaped to enhance light extraction.

11. The device of claim 8, wherein at least one of the shaped optical elements includes a phosphor layer.

12. The device of claim 11, wherein one or more surfaces of the phosphor layer is roughened, textured, patterned or shaped to enhance light extraction.

13. The device of claim 8, wherein the shaped optical elements have an inverted cone shape.

14. The device of claim 13, wherein the III-nitride layers are positioned within the inverted cone shape such that the light is reflected by sidewalls of the inverted cone shape.

15. The device of claim 1, wherein an insulating layer covering the III-nitride layers is partially removed, and a conductive layer is deposited within a hole or depression in the surface of the insulating layer to make electrical contact with the III-nitride layers.

16. The device of claim 1, wherein the III-nitride layers are wafer bonded to the transparent substrate or sub-mount-and light is extracted through the transparent substrate or sub-mount.

17. The device of claim 16, wherein the transparent substrate or sub-mount is electrically conductive.

18. The device of claim 17, wherein the III-nitride layers are wafer bonded with the transparent substrate or sub-mount using a transparent glue, a transparent epoxy, or other transparent material.

19. The device of claim 18, wherein the transparent glue, transparent epoxy, or other transparent material is electrically conductive.

20. The LED of claim 1, wherein the LED reduces re-absorption of the light by the active region and extracts the light more effectively as compared to an LED that has a mirror at its back side, so that light emitted by an active region, of the LED that has the mirror, and towards the mirror, is reflected for extraction at a front side of the LED that has the mirror.

21. The device of claim 1, wherein the shaped optical elements and the transparent substrate or sub-mount extract light from the LED, such that the light is extracted through at least the front side and the back side of the LED while reducing re-absorption of the light by the active region.

22. A method of fabricating a device, comprising:
forming a Light Emitting Diode (LED), wherein the LED comprises:
a plurality of III-nitride layers including an n-type layer, a p-type layer, and an active region between the n-type layer and the p-type layer that emits light, and
an n-type side of the LED is on a front side of the LED, and a p-type side of the LED is on a back side of the LED opposite the front side;
attaching a transparent substrate or sub-mount to a p-type side of the III-nitride layers only; and
forming one or more shaped optical elements combined with the LED and the transparent substrate or sub-mount, wherein the shaped optical elements and the transparent substrate or sub-mount extract light from the LED, such that the light is extracted through at least the front side and the back side of the LED.

23. The method of claim 22, wherein one or more transparent conducting layers are positioned to electrically connect the III-nitride layers.

24. The method of claim 23, wherein one or more current spreading layers are deposited on the III-nitride layers, and the transparent conducting layers are deposited on the current spreading layers.

25. The method of claim 22, wherein mirrors or mirrored surfaces are not formed on the front side or the back side of the LED.

26. The method of claim 22, wherein an insulating layer covering the III-nitride layers is partially removed, and a conductive layer is deposited within a hole or depression in the surface of the insulating layer to make electrical contact with the III-nitride layers.

27. The method of claim 22, wherein the LED reduces re-absorption of the light by the active region and extracts the light more effectively as compared to an LED that has a mirror at its back side, so that light emitted by an active region, of the LED that has the mirror, and towards the mirror, is reflected for extraction at a front side of the LED that has the mirror.

28. The method of claim 22, wherein a surface of one or more of the III-nitride layers is roughened, textured, patterned or shaped to enhance light extraction.

29. The method of claim 22, wherein a lead frame supports the III-nitride layers and the light emitted from the III-nitride layers is transmitted through the transparent plate in the lead frame.

30. The method of claim 29, wherein the III-nitride layers reside on a transparent plate in the lead frame, and the light emitted from the III-nitride layers is transmitted through the transparent plate in the lead frame.

31. The method of claim 22, wherein the III-nitride layers are embedded in the shaped optical elements, and the light is extracted from a plurality of surfaces of the III-nitride layers before entering the shaped optical element and subsequently being extracted.

32. The method of claim 31, wherein at least a portion of the light entering the shaped optical element lies within a critical angle and is extracted.

33. The method of claim 31, wherein one or more surfaces of the shaped optical element is roughened, textured, patterned or shaped to enhance light extraction.

34. The method of claim 31, wherein at least one of the shaped optical elements includes a phosphor layer.

35. The method of claim 34, wherein one or more surfaces of the phosphor layer is roughened, textured, patterned or shaped to enhance light extraction.

36. The method of claim 31, wherein the shaped optical elements have an inverted cone shape.

37. The method of claim 36, wherein the III-nitride layers are positioned within the inverted cone shape such that the light is reflected by sidewalls of the inverted cone shape.

38. The method of claim 22, wherein the III-nitride layers are wafer bonded to the transparent substrate or sub-mount and light is extracted through the transparent substrate or sub-mount.

39. The method of claim 38, wherein the transparent substrate or sub-mount is electrically conductive.

40. The method of claim 39, wherein the III-nitride layers are wafer bonded with the transparent substrate or sub-mount using a transparent glue, a transparent epoxy, or other transparent material.

41. The method of claim 40, wherein the transparent glue, transparent epoxy, or other transparent material is electrically conductive.

42. The method of claim 22, wherein the shaped optical elements and the transparent substrate or sub-mount extract light from the LED, such that the light is extracted through at least the front side and the back side of the LED while reducing re-absorption of the light by the active region.

* * * * *